United States Patent
Tanaka et al.

(10) Patent No.: US 8,294,079 B2
(45) Date of Patent: Oct. 23, 2012

(54) DIODE, PHOTODETECTOR CIRCUIT INCLUDING SAME, AND DISPLAY DEVICE

(75) Inventors: Kohei Tanaka, Osaka (JP); Christopher Brown, Oxford (GB)

(73) Assignee: Sharp Kabushiki Kaisha, Osaka (JP)

( * ) Notice: Subject to any disclaimer, the term of this patent is extended or adjusted under 35 U.S.C. 154(b) by 259 days.

(21) Appl. No.: 12/867,151

(22) PCT Filed: Jan. 14, 2009

(86) PCT No.: PCT/JP2009/050371
§ 371 (c)(1),
(2), (4) Date: Aug. 11, 2010

(87) PCT Pub. No.: WO2009/133716
PCT Pub. Date: Nov. 5, 2009

(65) Prior Publication Data
US 2010/0308212 A1    Dec. 9, 2010

(30) Foreign Application Priority Data

Apr. 28, 2008    (JP) .................................. 2008-117434

(51) Int. Cl.
*H01L 31/10* (2006.01)
*H01L 27/00* (2006.01)

(52) U.S. Cl. .................. 250/214.1; 250/208.1; 257/240; 257/458

(58) Field of Classification Search ............... 250/208.1, 250/214.1, 214 R; 348/294, 297, 308; 257/228, 257/231, 240, 458, 464
See application file for complete search history.

(56) References Cited

U.S. PATENT DOCUMENTS

2009/0140304 A1*  6/2009  Kudoh .......................... 257/292
2011/0291013 A1* 12/2011  Kurokawa et al. .......... 250/338.1

FOREIGN PATENT DOCUMENTS

| EP | 2 085 810 | 8/2009 |
| JP | 2006-267967 | 10/2006 |
| WO | 2006/129427 | 12/2006 |
| WO | 2007/145346 | 12/2007 |
| WO | 2007/145347 | 12/2007 |
| WO | 2008/044370 | 4/2008 |

OTHER PUBLICATIONS

International Search Report for PCT/JP2009/050371, mailed Apr. 21, 2009.

* cited by examiner

*Primary Examiner* — Kevin Pyo
(74) *Attorney, Agent, or Firm* — Nixon & Vanderhye, P.C.

(57) ABSTRACT

Each of even-numbered photodiodes 1 and 2 for constituting a diode of the present invention (i) has regions (regions 1a through 1c and regions 2a through 2c) whose sizes in a certain direction are identical to sizes of regions of a reference diode 5, and (ii) has a channel width equal to ½ of a channel width W of the reference diode 5. The regions 1a through 1c and the regions 2a through 2c are arranged so as to (i) extend parallel to the certain direction which is provided parallel to a channel length L of the reference diode 5, and so as to be (ii) line-symmetric or point-symmetric to each other as a whole. The photodiodes 1 and 2 are electrically connected to each other in series so as to carry out an equivalent operation to that of the reference diode 5. Employing of the photodiodes 1 and 2 provides a configuration of diodes each having an identical characteristic and occupying a reduced area on a substrate.

14 Claims, 13 Drawing Sheets

F I G. 2
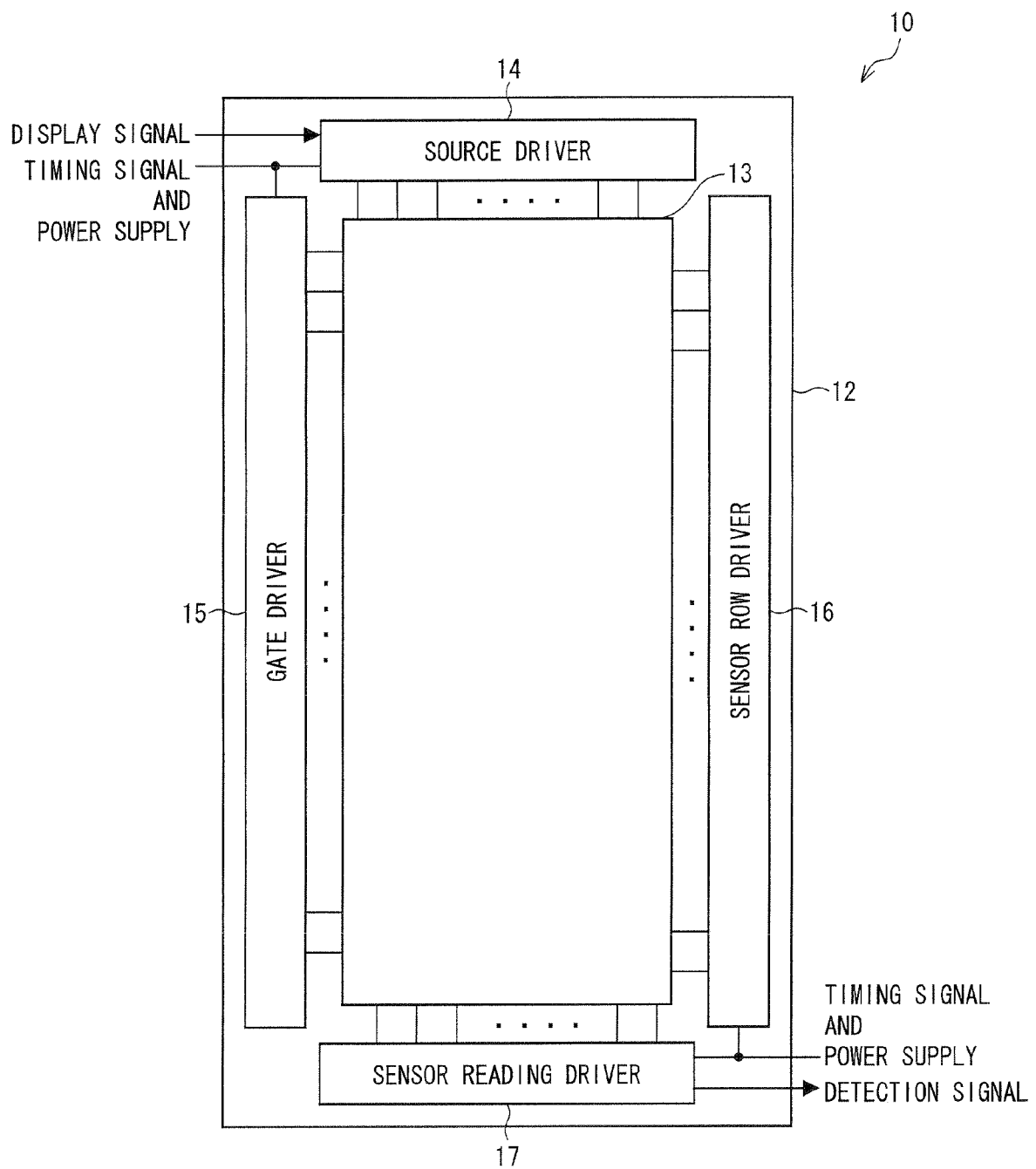

F I G. 1 0
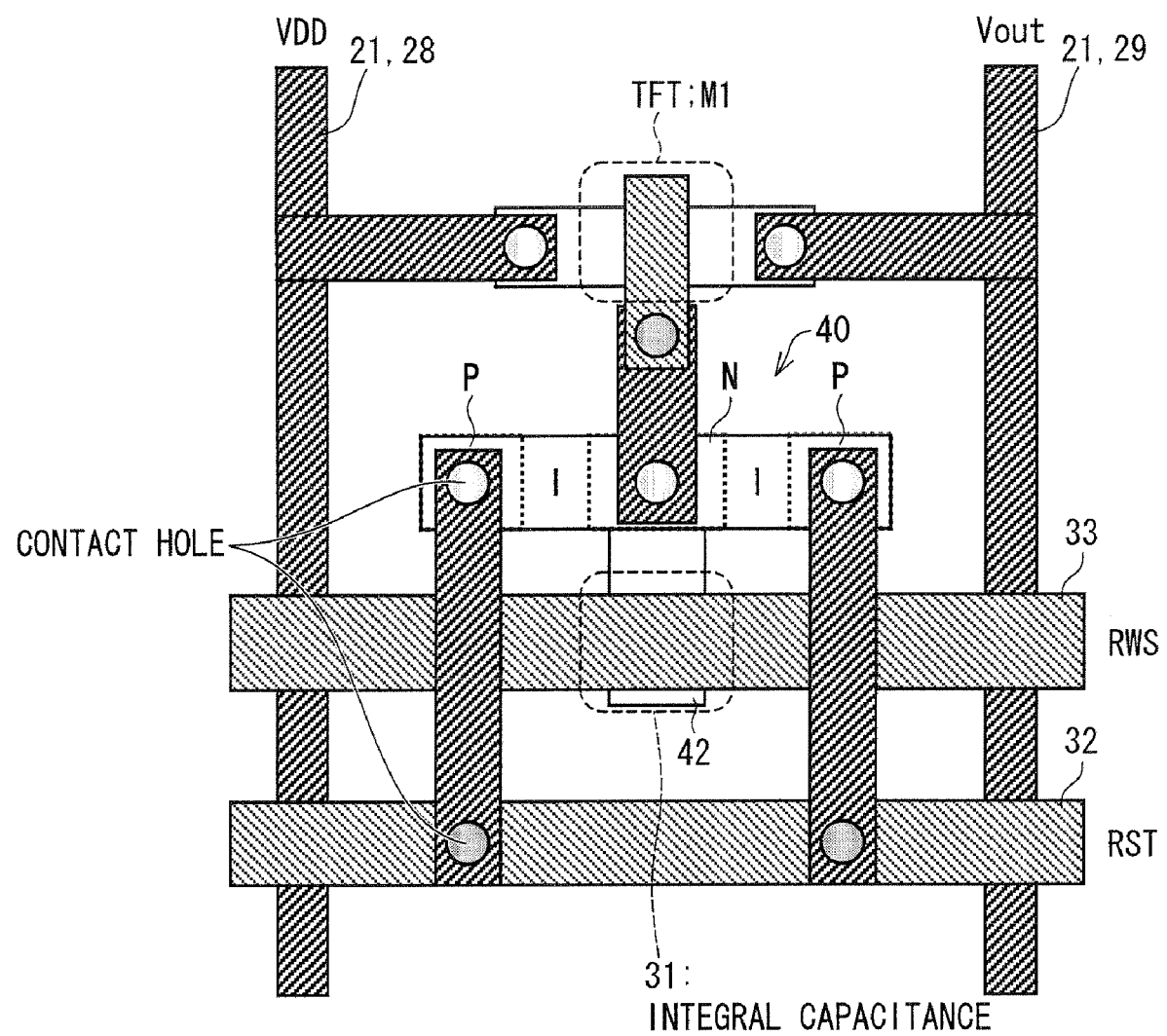

F I G. 1 8
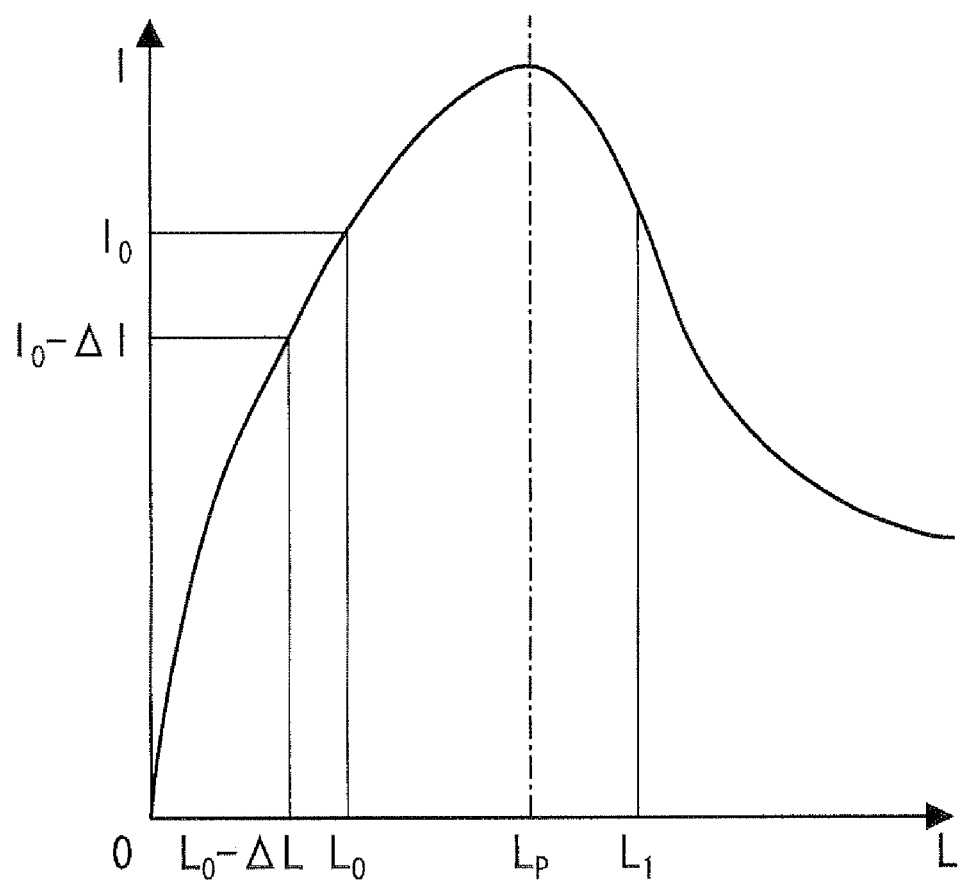

DIODE, PHOTODETECTOR CIRCUIT INCLUDING SAME, AND DISPLAY DEVICE

This application is the U.S. national phase of International Application No. PCT/JP2009/050371, filed 14 Jan. 2009, which designated the U.S. and claims priority to Japanese Patent Application No. 2008-117434, filed 28 Apr. 2008, the entire contents of each of which are hereby incorporated by reference.

TECHNICAL FIELD

The present invention relates, essentially, to a configuration of a diode. The present invention particularly relates to: a configuration of a diode which can remove individual differences among characteristics of diodes; a photodetector circuit including a diode having such configuration; and a display device including the photodetector circuit.

BACKGROUND ART

Recently, there have been developed such display devices as: a display device including photodetectors in a frame region surrounding a display screen; and a display device including a plurality of photodetectors each of which is provided, at a certain interval, for a display region of a display panel having a plurality of pixels, and is included within corresponding one of the plurality of pixels. Such display devices can make use of photodetection functions of the photodetectors so as to realize functions such as a function to perform light control to a backlight, a touch-panel function, an OCR function for character recognition, or a security function including fingerprint authentication.

An example of the photodetectors to be included in the display devices includes a PIN photodiode. The PIN photodiode has a configuration which is classified into a longitudinal configuration or a lateral configuration. In the longitudinal configuration, a P-type layer, an I-type layer, and an N-type layer are laminated in this order onto a substrate. In the lateral configuration, a P-type layer, an I-type layer, and an N-type layer are provided in a plane direction on a substrate. Note that the P-type layer is a semiconductor layer having high P-type impurity concentration, the I-type layer is an intrinsic semiconductor layer or a semiconductor layer having low impurity concentration, and the N-type layer is a semiconductor layer having high N-type impurity concentration.

The lateral configuration, out of these configurations, is a configuration in which the P-type layer, the I-type layer, and the N-type layer do not overlap one another. Thus, parasitic capacitance formed among these layers is small. This gives the lateral configuration a merit in that it has a sensing speed faster than that in the longitudinal configuration. Also, the lateral configuration has another merit in that it can be manufactured by a same process as that for manufacturing a TFT having a configuration such as PNP, PIP, NPN, or NIN.

FIG. 17 shows a photodetector which is a PIN photodiode having a lateral configuration (see Patent Literature 1 below). A photodetector 81 in FIG. 17 has a P-type layer 82, an I-type layer 83, and an N-type layer 84 which are formed onto a silicon film 85. The P-type layer 82, the I-type layer 83, and the N-type layer 84 are formed, in this order, along a plane direction of the silicon film 85. The silicon film 85 is formed on a glass substrate 90 serving as a base of an active matrix substrate. Also, the P-type layer 82 is connected to an electrode pattern 88 via a contact plug 86, and the N-type layer 84 is connected to an electrode pattern 89 via a contact plug 87.

When a reverse bias voltage is applied across such photodetector 81 and the photodetector 81 on this condition receives light, an electric charge is generated in amounts according to intensity of the light irradiation. A resultant current flows from the electrode pattern 89 to the electrode pattern 88.

Manufacturing of the PIN photodiode having the lateral configuration includes, for example, (i) covering the silicon film 85 by a mask having a pattern for preparing the P-type layer 82, and performing thereonto ion implantation of P-type impurities including boron, and (ii) covering the silicon film 85 by another mask having a pattern for preparing the N-type layer 84, and performing thereonto ion implantation of N-type impurities including phosphor and arsenic.

In order that the photodetector 81 may generate a larger current due to light reception, it should be employed to increase a size W (see FIG. 17: hereinafter referred to as a channel width W) of longitudinal sides of the I-type layer 83 by which the I-type layer 83 is in contact with the P-type layer 82 and the N-type layer 84. Note that a relation between a size L (hereinafter referred to as a channel length L) of a transverse side of the I-type layer 83 and an intensity I of the current is as shown I FIG. 18.

That is, as shown in FIG. 18, as the channel length L is increased from 0, a current I is increased in a range to Lp at which recombination of an electron hole and electron in the I-type layer 83 is greater than generation thereof. Thus, the amplitude I is increased in a range where 0<L<Lp, becomes maximum at L=Lp, and is decreased in a range where Lp<L due to recouping.

CITATION LIST

Patent Literature 1

International Publication No. WO 2006/129427 A1 (Publication Date: Dec. 7, 2006)

SUMMARY OF INVENTION

However, a configuration of a conventional photodetector 81 has a first problem in that it is difficult to manufacture PIN photodiodes each having a same characteristic, and a second problem in that photodiodes formed onto a substrate occupy a greater area since it is necessary to increase a channel width W in order to enhance a light receiving sensitivity.

The first problem in turn causes a problem in that display devices including such photodetector 81 have individual difference in the functions described above.

The second problem in turn causes (i) a problem in that in case of configuring a display device so that each pixel includes such photodetector 81, it is difficult to manufacture a high-resolution display device having a high pixel density, because the photodetector 81 occupies a larger area in the pixel, or (ii) a problem in that a display device including such photodetector 81 in each pixel suffers a deterioration in brightness of a display screen while having foregoing functions, because the photodetector 81 contributes to a reduction in pixel aperture rate.

A reason for the first problem is further explained as follows. At time when ion implantations are carried out so as to form a P-type layer 82 and an N-type layer 84, there occurs positional displacement of a mask for preparing the P-type layer or that of a mask for preparing the N-type layer. As a result, a channel length L differs from a designed value, and this contributes to the first problem.

As shown in FIG. 17, for example, in a case where a mask is displaced toward an I-type layer 83 by ΔL at time when the N-layer 84 is formed, the channel length L of the I-type layer 83 will become L−ΔL. However, in a case where the channel length L is designed to be in a range of 0<L<Lp as shown in FIG. 18, this makes it impossible that a designed current I0 to the designed value L0 be obtained. Instead, a reduced current I0−ΔI, which corresponds to Lo−ΔL in channel length L, is obtained. Thus, a change in channel length L causes a change in a detection value obtained from a current generated by the photodetector 81.

Note that there is a case in which the designed current I0 is increased, instead of being decreased. For example, such case occurs when the mask used in preparing the N-type layer 84 is displaced in an opposite direction to a direction in which the positional displacement of the above example occurs, and therefore, the channel length L is increased more than the designed value L0. Positional displacement of the mask for preparing the P-type layer contributes, independently from the positional displacement of the mask for preparing the N-type layer, to the difference in channel length L.

The present invention is made in view of the problem, and an object of the present invention is to provide: a configuration of diodes each having a lateral configuration in which an intrinsic semiconductor region is between impurity semiconductor regions, which configuration of diodes can give the diodes a stable characteristic and reduce the diodes in area on a substrate; a photodetector circuit which employs the diodes having the stable characteristic, so as to be able to carry out stable photodetection; and a display device in which functions using the photodetection can be made stable.

In order to attain the object, a diode of the present invention is a diode, including: N diodes (N: an even number of 2 or larger), each having (i) semiconductor regions which are identical in size, in a certain direction parallel to a channel length of a reference diode, to those of the reference diode and (ii) a substantially identical channel width W1 which is smaller than a channel width W of the reference diode, where it is assumed that the reference diode has the channel width W, and that the reference diode has (i) a first semiconductor region of a first-type which is relatively high in impurity concentration, (ii) a channel region which is a semiconductor region and is relatively low in impurity concentration, and (iii) a second semiconductor region of a second-type which is relatively high in impurity concentration, the second-type being opposite to the first-type, and the first semiconductor region, the channel region, and the second semiconductor region being in contact with one another and being arranged, in this order, in a certain direction in a surface of a substrate, corresponding semiconductor regions of the N diodes being arranged on the substrate, in directions parallel to the certain direction, so as to have a line-symmetric or point-symmetric arrangement relation as a whole, and the N diodes being electrically connected to one another so as to carry out an operation equivalent to that of the reference diode.

In the configuration, the channel length is a size of the channel region with respect to the direction parallel to the certain direction in the surface of the substrate. Note that the channel region is provided between the first and the second semiconductor regions. In view of this, the channel length can be also said as a size of a distance between two boundaries, one of which is formed between the first semiconductor region and the channel region, and the other one of which is formed between the channel region and the second semiconductor region.

The channel width, on the other hand, is a linear size of the boundary formed between the first semiconductor region and the channel region or that of the boundary formed between the channel region and the second semiconductor region.

The description "substantially identical" means that even if an individual difference of channel widths W1 of the N diodes occurs in a process intended to manufacture the N diodes having identical channel widths W1, the channel widths W1 are considered to be identical with one another if such individual difference is within a margin of error.

A photocurrent generated by the photodiode has maximum amplitude with respect to the above channel length. Such photocurrent is increased in a range where the channel length is in a range from 0 to a point at which the photocurrent has the maximum amplitude, and is decreased in a range above the point at which the photocurrent has the maximum amplitude.

Therefore, the I-V characteristic, which is indicative of a relation between a current flowing into a diode and a voltage across the diode, has a linear change with respect to the channel length in one range, has a change considered to be linear with respect to the channel length in another range, and has a change nonlinear with respect to the channel length in the other range.

The diode of the present invention is configured such that: "it includes N diodes (N: an even number of 2 or larger), each having (i) semiconductor regions which are identical in size, in a certain direction parallel to a channel length of a reference diode, to those of the reference diode and (ii) a substantially identical channel width W1 which is smaller than a channel width W of the reference diode; and "the N diodes are electrically connected to one another". The configuration allows even-numbered diodes, in combination, to carry out an equivalent operation with that of the reference diode.

Considering that an I-V characteristic of a diode changes depending on both a channel width and a channel length of the diode, this indicates that the diode of the present invention is configured so that (i) ranges for the channel width W1 and the channel length are selected appropriately, and (ii) electric connection of the N diodes are selected appropriately from parallel connection, serial connection, and a combination thereof.

The even-numbered diodes thus configured are laid out on the substrate in accordance to the following arrangement. Namely, semiconductor regions constituting the even-numbered diodes are arranged on the substrate so as to align in a direction parallel to the certain direction and so as to have a line-symmetric or point-symmetric arrangement relation as a whole. Note that the certain direction is a same direction as a direction parallel to a channel length direction.

According to the configuration, in a case where positional displacement of a mask used in preparing first semiconductor regions by impurity ion implantation occurs in, for example, a first direction so as to cause a reduction in channel length of one diode (referred to as a diode α) of the even-numbered diodes which is positioned at one side in the line-symmetric point-symmetric arrangement relation, the positional displacement of the mask in the same first direction also occurs to the other diode (referred to as diode β) of the even-numbered diodes which is positioned at the other side in the line-symmetric or point-symmetric arrangement relation. Note that the first direction is headed from, for example, the first semiconductor region to the channel region in the diode α, and is headed from the channel region to the first semiconductor region in the diode β in which the semiconductor regions have the line-symmetric or point-symmetric arrangement relation to the semiconductor regions of the diode α.

Therefore, in the diode β, the positional displacement of the mask for the first semiconductor regions occurs in the direction headed from the channel region to the first semiconductor region, and thus, an increase in channel length of the diode β is caused. In this situation, a size by which the channel length of the diode β is increased is same as a size by which the channel length of the diode α is decreased.

According to the present invention, therefore, even in the case of the positional displacement of the mask, the reduction in channel length of the diode α is offset by the increase in channel length of the diode β. Furthermore, since the semiconductor regions of the diodes α and β have identical sizes in the direction parallel to the direction of the channel length of the reference diode, a channel length obtained by averaging the channel length of the diode a thus increased and that of the diode 13 thus decreased is identical with the channel length of the reference diode.

If a change in I-V characteristic of one diode due to a reduction in channel length is not offset by a change in I-V characteristic of another diode due to an increase in channel length, there will rise another problem that an I-V characteristic of a diode varies depending on a degree of positional displacement of a mask. However, with the present invention, two opposite changes in the characteristic can be offset by each other, and therefore, such problem can be prevented. This is assured under, as described above, the requirement "the plurality of diodes are electrically connected to each other so as to carry out an equivalent operation with that of the reference diode".

With the present invention, it is therefore always possible to manufacture, regardless of positional displacement of a mask for preparing first semiconductor regions or positional displacement of a mask for preparing second semiconductor regions, which occur independently from each other in any direction, diodes having a stable characteristic which in combination carry out an equivalent operation with that of the reference diode.

Furthermore, since the channel width W1 of each of the plurality of diodes is smaller than the channel width W of the reference diode, it is possible to reduce, in a direction parallel to the channel width, an area occupied by the plurality of diodes on the substrate.

Concerning the diode of the present invention, a channel length of the channel regions of the N diodes is selected from a range where an I-V characteristic, which is indicative of a relation between a current flowing into a diode and a voltage across the diode, changes in a form considered to be linear in response to a change in the channel length.

Thus, as discussed in the example where the diode α and the diode β are exemplified, in a case where the reduction in channel length of the diode α is offset by the increase in channel length of the diode β, an I-V characteristic of the diode α, which shows a change considered to be linear with respect to the channel length, is offset by that of the diode β.

Therefore, the configuration provides a design guide for a channel length, the diode of the present invention thus configured in accordance to which can carry out the equivalent operation with that of the reference diode.

Concerning the channel width W1, the I-V characteristic of the diode shows a change considered to be linear with respect to a change in channel width. Therefore, in a case of having a channel width W1 being set equal to W/N, for example, each of the N diodes constituting the diode of the present invention has an I-V characteristic equal to 1/N of the I-V characteristic of the reference diode. This is based on a linear relation between the channel width W1 and the I-V characteristic of the diode.

Since the I-V characteristic of the diode changes linearly in response to the change in channel width, it is easier that a design which satisfies the requirement of the present invention "N is an even number" is employed. Specifically, the channel width W1 of each of the N diodes should be set equal to W/N.

The diode of the present invention can be configured so that the N diodes, thus having the channel width W1 being set equal to W/N, are connected to one another in parallel.

The configuration is made on assumption that the channel width W1 is selected from a range where an I-V characteristic of a diode changes linearly in response to a change in channel width. In a case where N=2 under such assumption, for example, a channel width W1 of two diodes constituting the diode of the present invention is set so that W1=W/2, and the two diodes thus having such channel width are electrically connected to each other in parallel. Therefore, the diode of the present invention can carry out the equivalent operation with that of the reference diode.

In a case where N=4, the channel width W1 of four diodes constituting the diode of the present invention is set so that W1=W/4, and the four diodes thus having such channel width are electrically connected to one another in parallel. Therefore, the diode of the present invention can carry out the equivalent operation with that of the reference diode.

As discussed in the above, in a case where (i) the channel width W1 of the N diodes is selected from the range where the I-V characteristic of a diode changes in a form considered to be linear in response to a change in channel width and (ii) the N diodes thus having such channel width W1 are electrically connected to one another in parallel, the channel width W1 and N have an inverse relation to each other.

Note that as later discussed in Embodiments, a combination of a channel length and electric connection for allowing the diode of the present invention to carry out the equivalent operation with that of the reference diode includes variations.

The diode of the present invention may be configured so that the N diodes includes a first group of N/2 diodes which are electrically connected to one another in series, and a second group of N/2 diodes which are electrically connected to one another in series, the first group of N/2 diodes and the second group of N/2 diodes being electrically connected to each other in parallel, and having the channel width W1 being set equal to W/2.

The configuration is made on a premise that the channel width W1 is selected from the range where the I-V characteristic of the diode has a change considered to be linear with respect to a change in channel width. In a case where N/2 photodiodes, each having the channel width W1 of W/2, are electrically connected to one another in series, a voltage across each of N/2 photodiodes is reduced to 2/N of a voltage across entire N/2 photodiodes, where 2/N of a voltage across entire N/2 photodiodes is a product obtained by multiplying (i) the voltage across entire N/2 photodiodes by (ii) an inverse of the number (i.e., N/2) of the photodiodes connected to one another in series. As such, according to a linear relation between the I-V characteristic and the channel width of the diode, the I-V characteristic of entire N/2 photodiodes which are electrically connected to one another in series is identical to that of each of N/2 photodiodes.

The channel width W1 is set equal to W/2, based on this fact. Thus, the above configuration is identical in I-V characteristic with a configuration in which two diodes, each having the channel width W1 being set equal to W/2, are connected to each other in parallel so as to obtain an equivalent I-V characteristic with that of the reference diode.

The diode of the present invention may be configured so that: the N diodes are a first diode and a second diode, i.e., the N diodes includes at least two diodes, which are provided in a single Si island and share a first semiconductor region as the first semiconductor region or a second semiconductor region as the second semiconductor region.

In the configuration, in a case where a first semiconductor region is shared by the first diode and the second diode as the first semiconductor region, the first diode and the second diode are connected to each other in parallel by electrically connecting the second semiconductor region of the first diode and that of the second diode with each other. If each of the first diode and the second diode has the channel length that is selected, as needed, from a range where the I-V characteristic of the diode has a change considered to be linear with respect to change in channel length, and the channel width that is selected, as needed, from a range where the I-V characteristic of the diode has a change considered to be linear with respect to change in channel width, the first diode and the second diode in combination constitute the diode which carries out the equivalent operation with that of the reference diode.

In case of examining the configuration in light of foregoing requirement "corresponding semiconductor regions of the plurality of diodes are arranged on a substrate so as to extend in a direction parallel to the certain direction, and so as to have a line-symmetric or point-symmetric arrangement relation as a whole", it is found as follows. Namely, in the first diode, the second semiconductor region, the channel region, and the first semiconductor region are arranged, in this order, along the certain direction; and in the second diode, the first semiconductor region shared by the first diode and the second diode, the channel region, and the second semiconductor region are arranged, in this order, along the certain direction.

Since the first diode and the second diode thus share a first semiconductor region as the first semiconductor region or a second semiconductor region as the second semiconductor region, both the first diode and the second diode can be formed onto a single Si island. This in turn makes the first diode and the second diode advantageous for the purpose of a reduction in area occupied by them on the substrate.

The diode of the present invention may be configured so that: (1) N is 4, i.e., the diodes of the present invention is made up of at least four diodes, so that the N diodes includes a first diode, a second diode, a third diode, and a fourth diode which are arranged, in this order, along the certain direction, and the second diode and the third diode share a first semiconductor region as the first semiconductor region; (2) the second diode has a configuration equivalent to that of the fourth diode, and the fourth diode and the third diode are connected to each other, in series, along the certain direction; (3) the first diode has a configuration equivalent to that of the third diode, and the first diode and the second diode are connected to each other, in series, along the certain direction; (4) the first diode and the second diode share a second semiconductor region as the second semiconductor region; (5) the third diode and the fourth diode share a second semiconductor region as the second semiconductor region; (6) the first semiconductor region is electrically connected to a first semiconductor region of the first diode and to that of the fourth diode; and (7) the second semiconductor regions are electrically connected to each other.

According to the configurations (1), (4), and (5), adjacent ones of the first through fourth diodes either share a first semiconductor region as the first semiconductor region or share a second semiconductor region as the second semiconductor region. It is therefore possible that such four diodes be formed into a single Si island. This in turn makes the four diodes advantageous for the purpose of a reduction in their area on the substrate.

According to the configuration (2), the second diode has semiconductor regions (a first semiconductor region, a second semiconductor region, and a channel region) which are arranged in a same order in which semiconductor regions (a first semiconductor region, a second semiconductor region, and a channel region) of the fourth diode are arranged. According to the configuration (3), the first diode has semiconductor regions which are arranged in a same order in which semiconductor regions of the third diode are arranged. When putting different interpretation on this, (i) the semiconductor regions of the second diode are arranged in an order reverse to the order in which the semiconductor regions of the third diode are arranged, i.e., the semiconductor regions of the second diode and the semiconductor regions of the third diode are provided so as to be symmetric to each other, and (i) the semiconductor regions of the first diode are arranged in an order reverse to the order in which the semiconductor regions of the fourth diode are arranged, i.e., the semiconductor regions of the first diode and the semiconductor regions of the fourth diode are provided so as to be symmetric to each other.

Thus, the configuration meets the requirement "corresponding semiconductor regions of the plurality of diodes are arranged on the substrate so as to extend in the direction parallel to the certain direction, and so as to have a line-symmetric or point-symmetric configuration as a whole".

The configurations (6) and (7) indicate that the first through fourth diodes are electrically connected to one another in parallel. As discussed above, it is therefore possible to obtain diodes, which carry out the equivalent operation with that of the reference diode in case of having channel length and channel width that are selected as needed from ranges where the I-V characteristic of a diode changes in a form considered to be linear in response to changes in channel length and channel width.

In a photodetector circuit of the present invention, any of the diodes described above is employed as a photodiode.

The diodes described above are all configured so that their semiconductor regions are arranged on the substrate so as to be line-symmetric or point-symmetric to one another, and therefore, the diodes described above carry out the equivalent operation with that of the reference diode. Thus, a photodetector circuit employing any of such diodes as a photodiode can obtain a stable light receiving characteristic which is not affected by any positional displacement of a mask occurring in a manufacturing step.

Each of the plurality of diodes thus has the identical channel width W1 which is smaller than the channel width W of the reference diode. Therefore, the photodetector circuit of the present invention can employ, as a layout on the substrate, a layout with a reduced channel width.

This makes it possible, in case of providing the photodetector circuit in a pixel of a liquid crystal display device, to provide each of the plurality of diodes in a different pixel. A ratio of a channel width to a longitudinal size of each pixel can be smaller than a ratio obtained of the channel width of the reference diode to the longitudinal size of the pixel. This brings about a secondary effect that causes an improvement in pixel aperture ratio or the like.

In a display device of the present invention, the photodetector circuit recited in claim 9 is included in one or more of a plurality of pixels for constituting a display screen.

Therefore, a light receiving characteristic of the photodetector circuit is not varied from one display device to another, and is stable among displace devices. This makes it possible to provide display devices in which functions using a function of the photodetector, including a function for controlling an intensity of a backlight and a touch-panel function, are stable.

In the display device, the photodetector circuit is included in a predetermined number of adjacent pixels of the plurality of pixels; and the diode and the other elements for constituting the photodetector circuit are provided and dispersed in the predetermined number of adjacent pixels.

The predetermined number of adjacent pixels is an integral number of 2 or larger. This makes it possible to provide a display device having stable functions which use the function of a photodetector circuit. The functions using the function of a photodetector circuit include: a function for controlling an intensity of a backlight; a touch-panel function; an OCR function for character recognition; and a security function such as fingerprint authentication.

Furthermore, since the ratio of the photodiode and the elements for constituting the photodetector circuit to the pixel can be reduced, it is possible to provide an excellent display device which has the stable functions and carries out bright display.

A combination of a feature in focused claim and a feature in another claim is not limited to a combination of a feature in focused claim and a feature in another claim from which focused claim depends. Instead, a feature in focused claim can be combined with a feature in another claim from which focused claim does not depend, provided that such a combination of features attain the object of the present invention.

For a fuller understanding of the nature and advantages of the invention, reference should be made to the ensuing detailed description taken in conjunction with the accompanying drawings.

Figure 1:
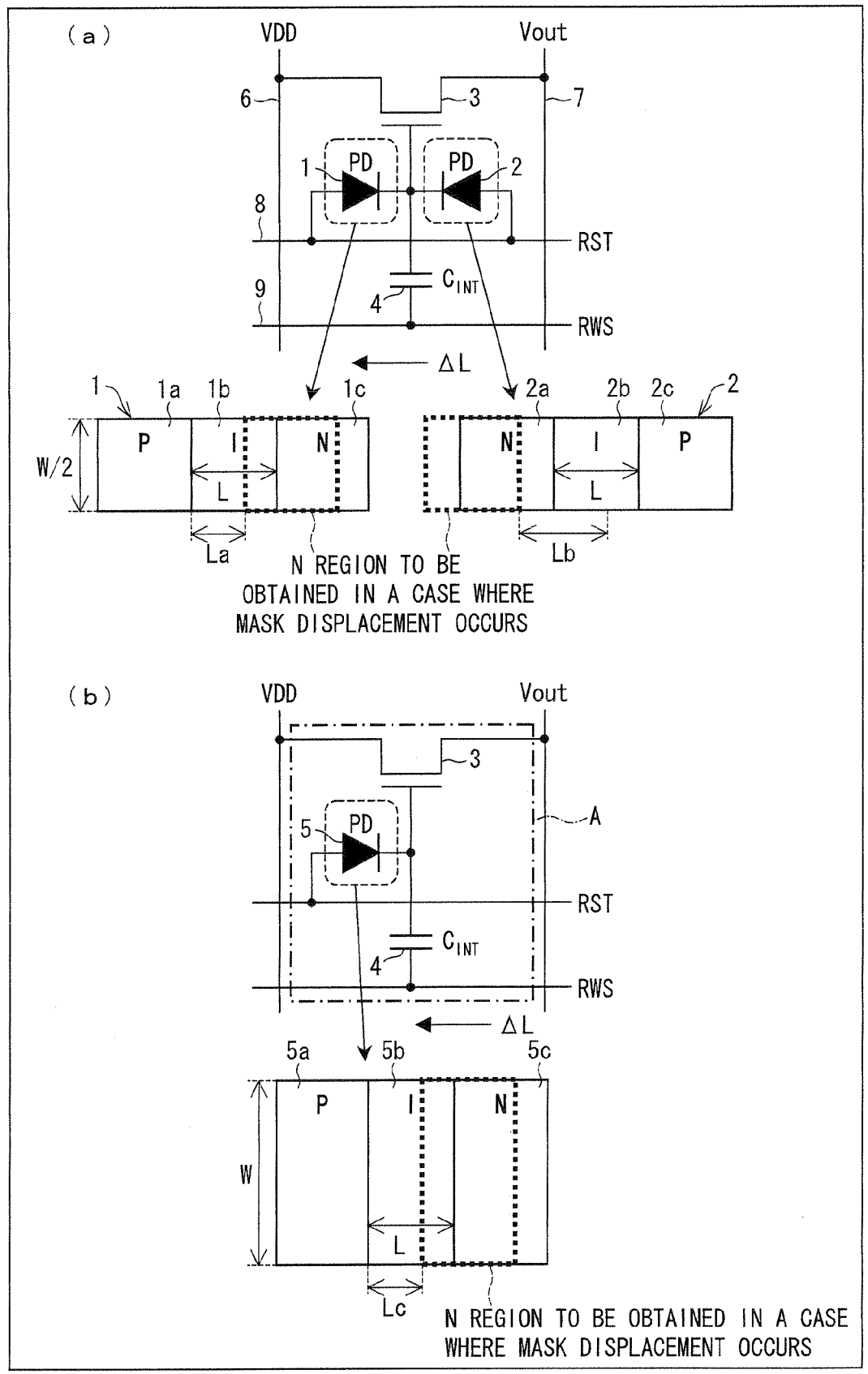
FIG. 1

(a) of FIG. 1 is both (i) a circuit diagram showing a configuration of a photodetector circuit that includes a photodiode being made up of diodes of the present invention, and (ii) an explanation view showing an offset principle in channel regions. (b) of FIG. 1 is both (i) a circuit diagram showing a configuration of a photodetector circuit that includes a photodiode for serving as a reference diode, and (ii) an explanation view showing a problem in that a reduction in size of a channel region occurs.

FIG. 2

FIG. 2 is a block diagram schematically showing a configuration of a display device of the present invention.

FIG. 3

Figure 3:
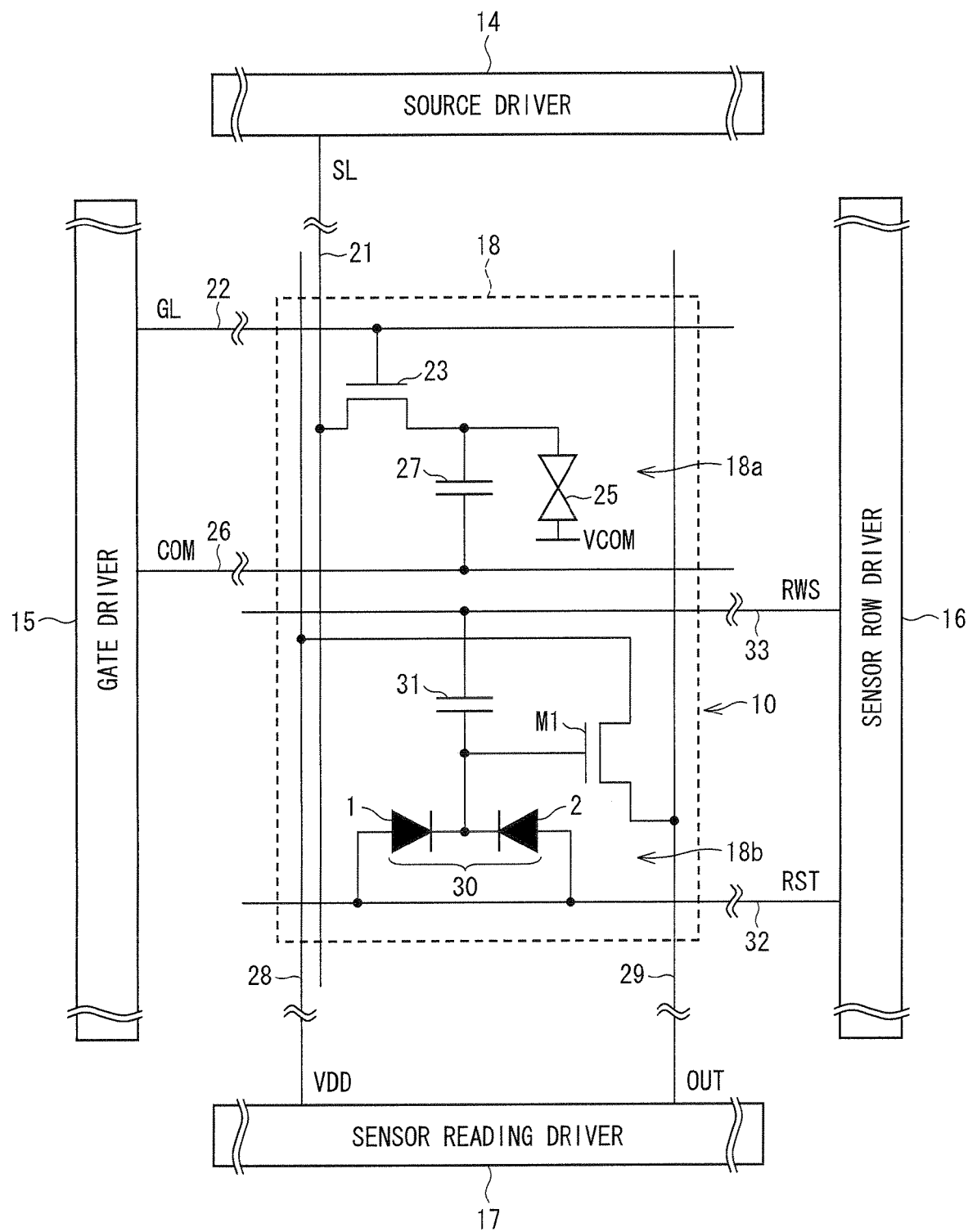

FIG. 3 is a circuit diagram showing respective configurations of a displaying circuit and a photodetector circuit, each for constituting a pixel circuit provided in one of pixels of the display device.

FIG. 4

Figure 4:
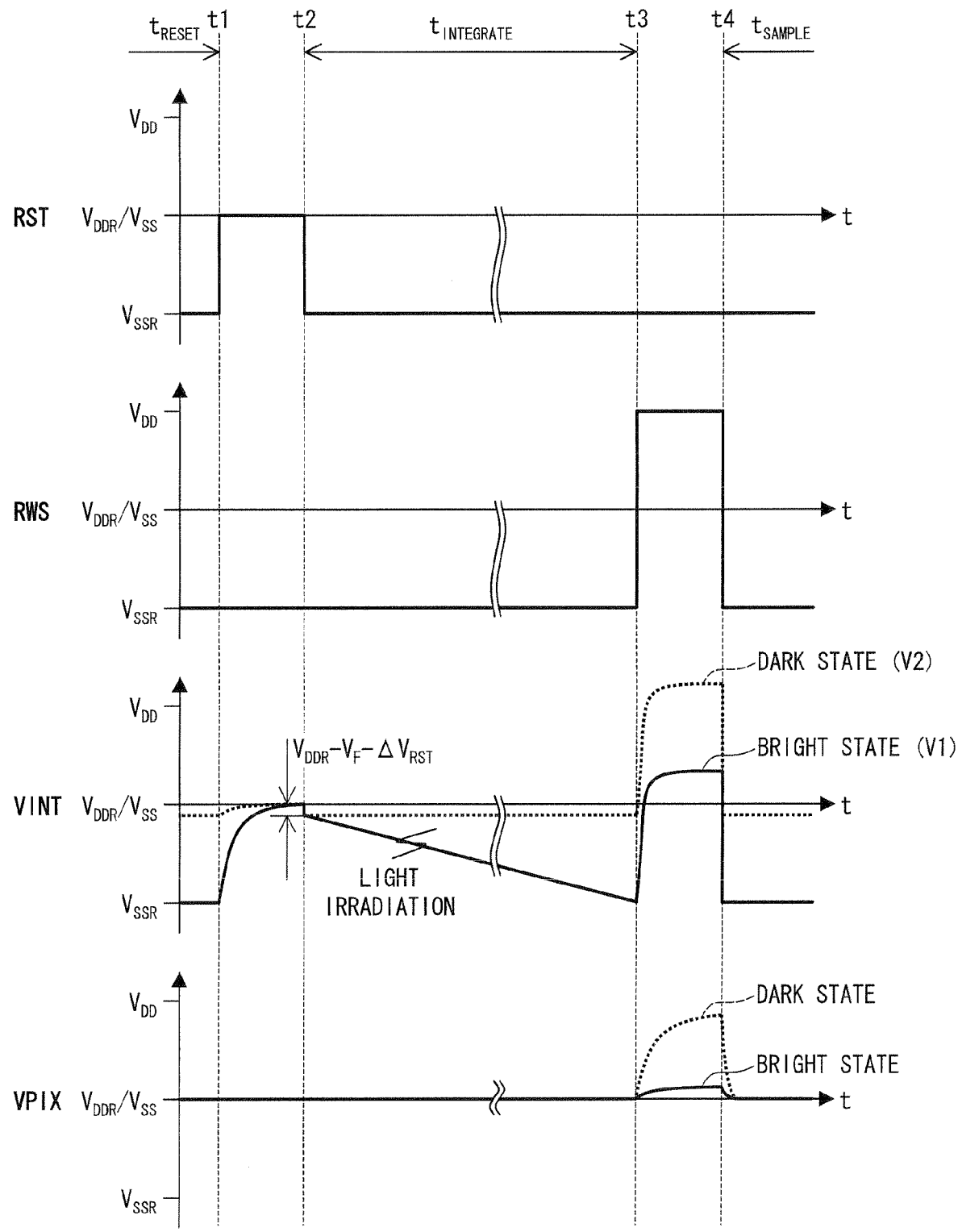

FIG. 4 is a timing chart showing operations of the photodetector circuit.

FIG. 5

Figure 5:
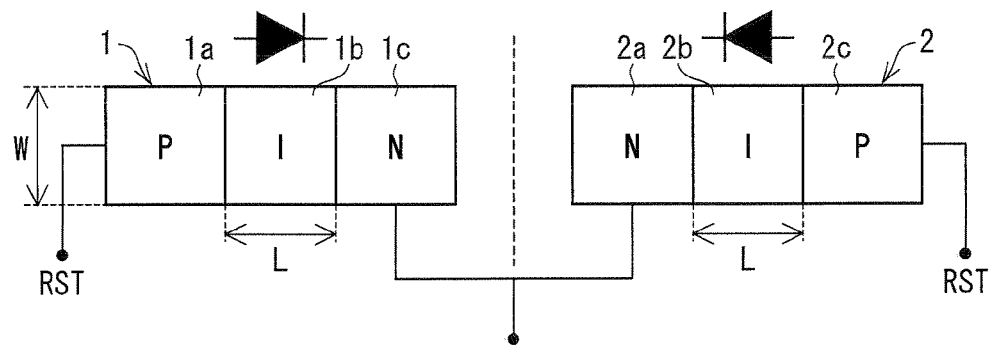

FIG. 5 is an explanation view showing electric connections of semiconductor regions of the photodiode shown in (a) of FIG. 1.

FIG. 6

Figure 6:
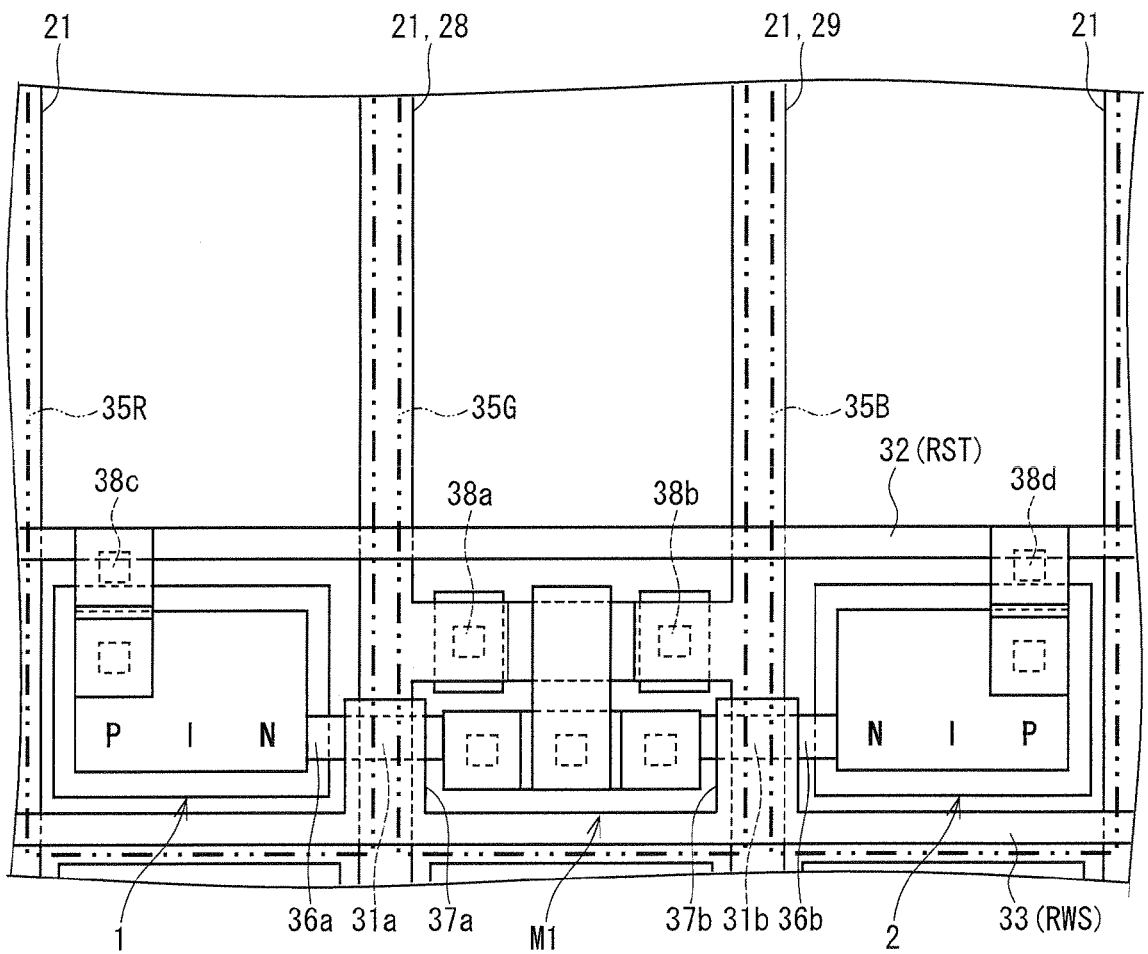

FIG. 6 is a plan view showing a concrete configuration including the photodetector circuit in a pixel.

FIG. 7

FIG. 7

Figure 7:
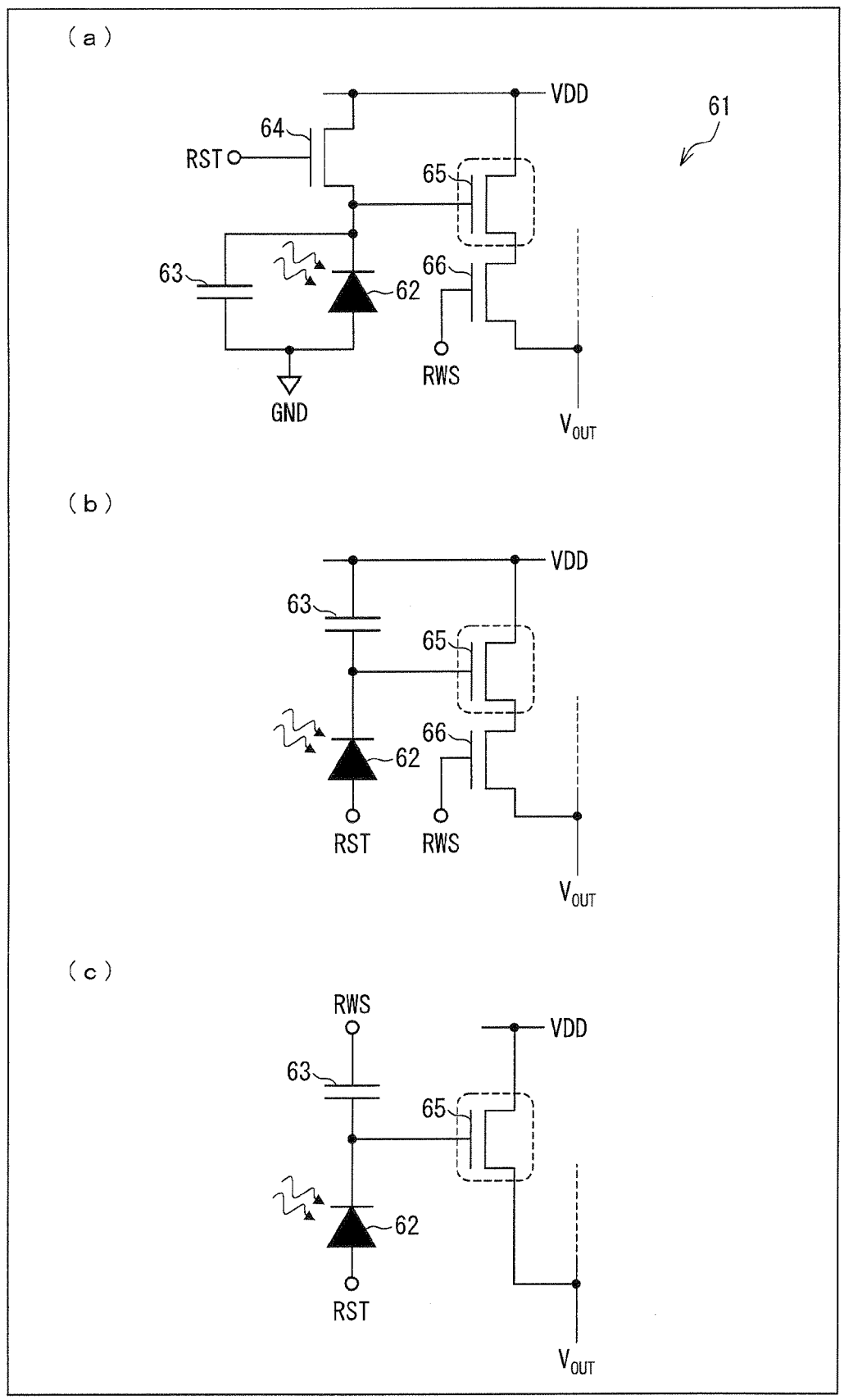

(a), (b), and (c) of FIG. 7 are circuit diagrams each showing a variation of the photodetector circuit employing the photodiodes of the present invention. (a) of FIG. 7 is the circuit diagram showing a photodetector circuit of 3T type, (b) of FIG. 7 is the circuit diagram showing a photodetector circuit of 2T type, and (c) of FIG. 7 is the circuit diagram showing a photodetector circuit of 1T type.

FIG. 8

Figure 8:
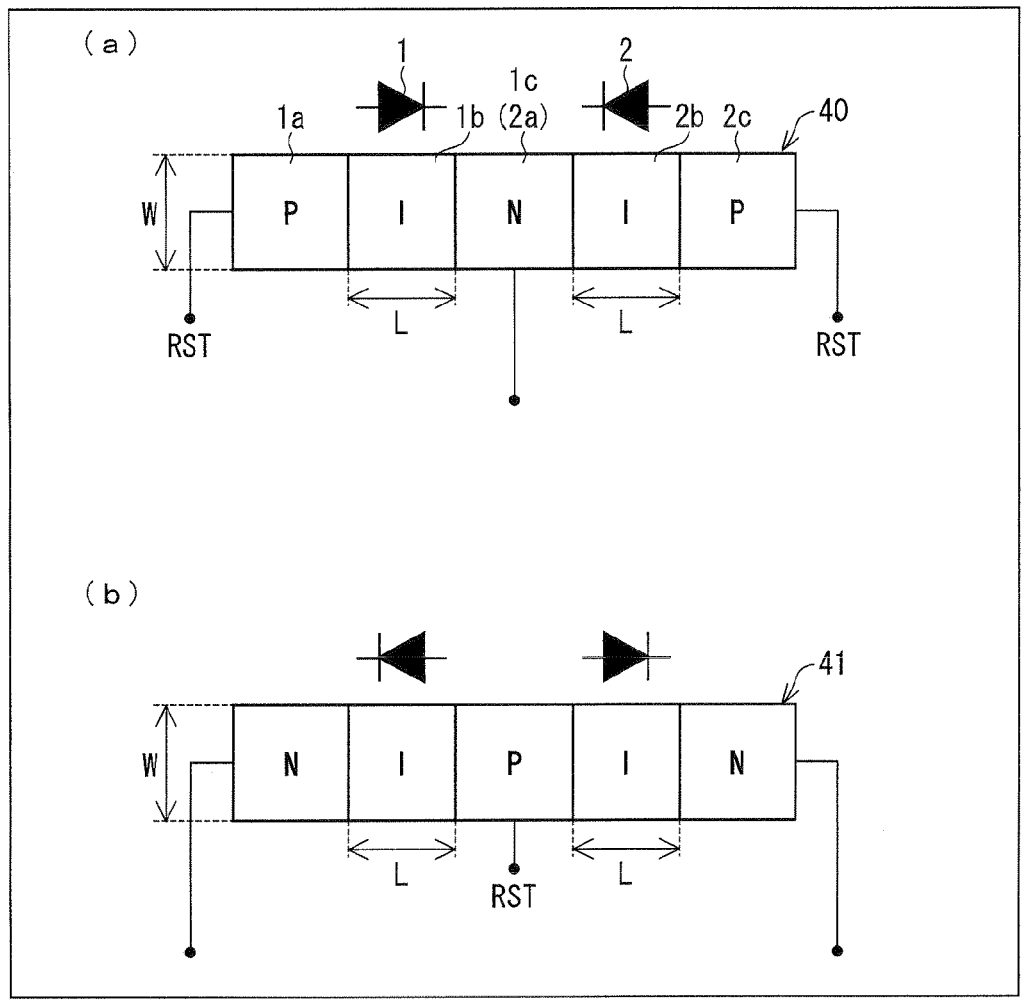

FIG. 8 is an explanation view showing an example in which two photodiodes are provided in one Si island.

FIG. 9

Figure 9:
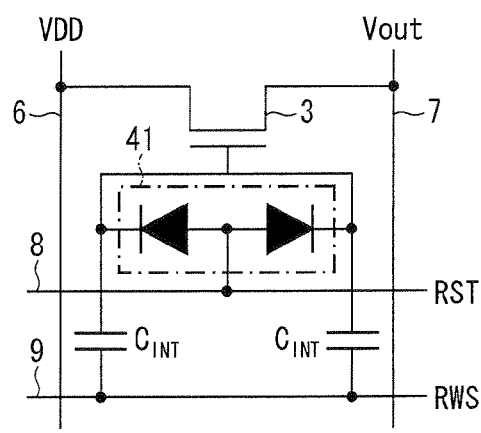

FIG. 9 is a circuit diagram showing a configuration of a photodetector circuit that employs a photodiode shown in (b) of FIG. 8.

FIG. 10

FIG. 10 is a plan view schematically showing one example of a layout of a photodetector circuit that includes, in one pixel, a photodiode shown in (a) of FIG. 8.

FIG. 11

Figure 11:
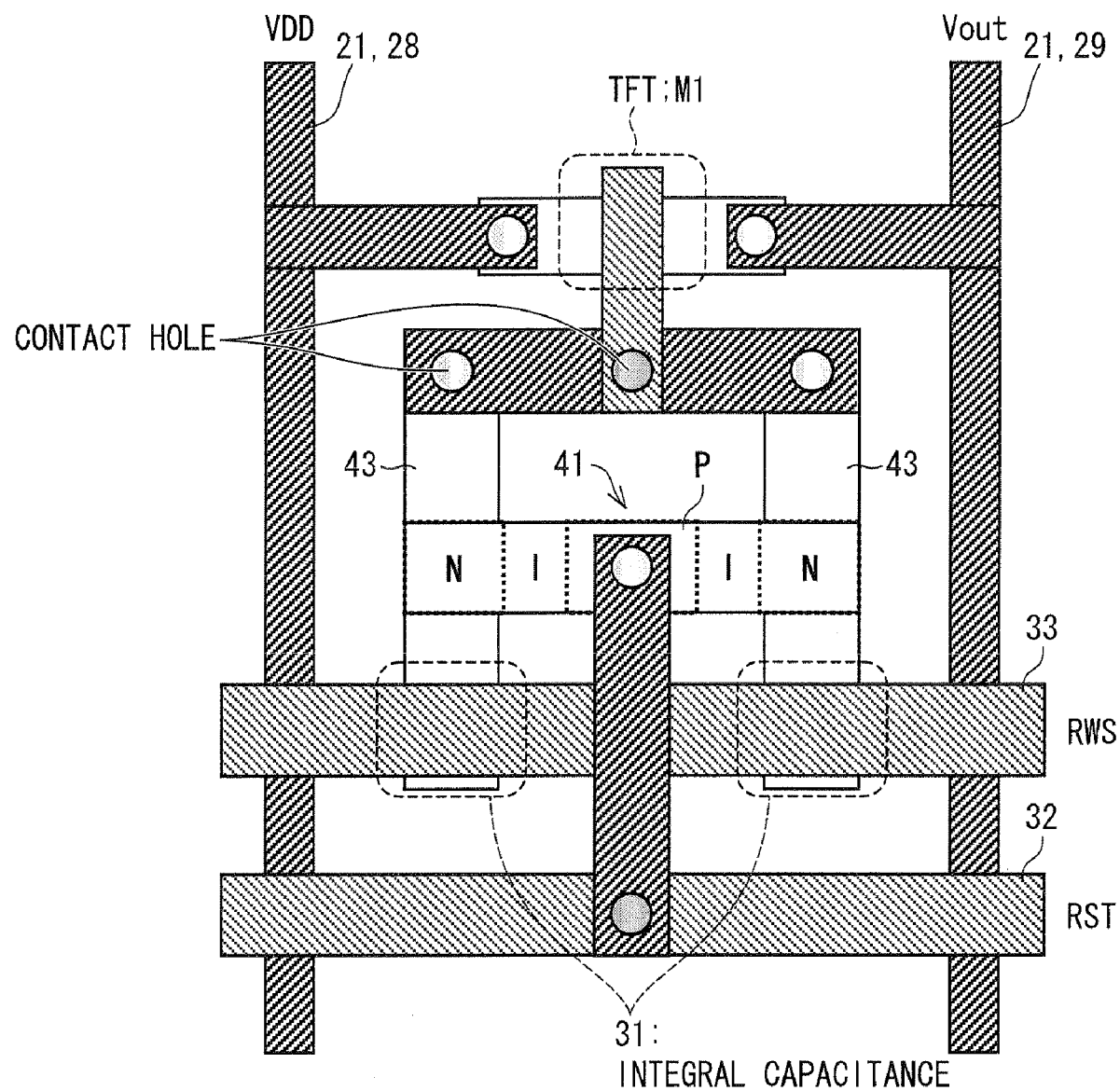

FIG. 11 is a plan view schematically showing one example of a layout of a photodetector circuit that includes, in one pixel, the photodiode shown in (b) of FIG. 8.

FIG. 12

Figure 12:
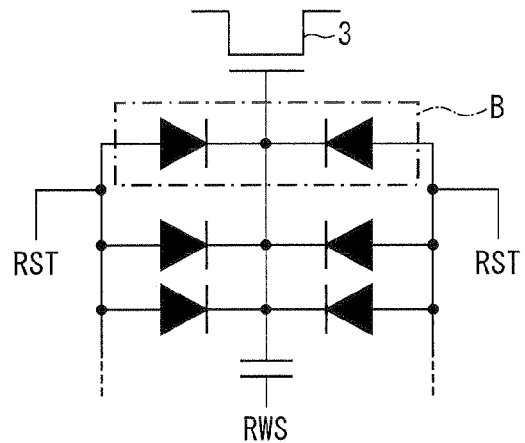

FIG. 12 is a circuit diagram showing an example of a photodetector circuit that employs N photodiodes being connected to one another in parallel.

FIG. 13

Figure 13:
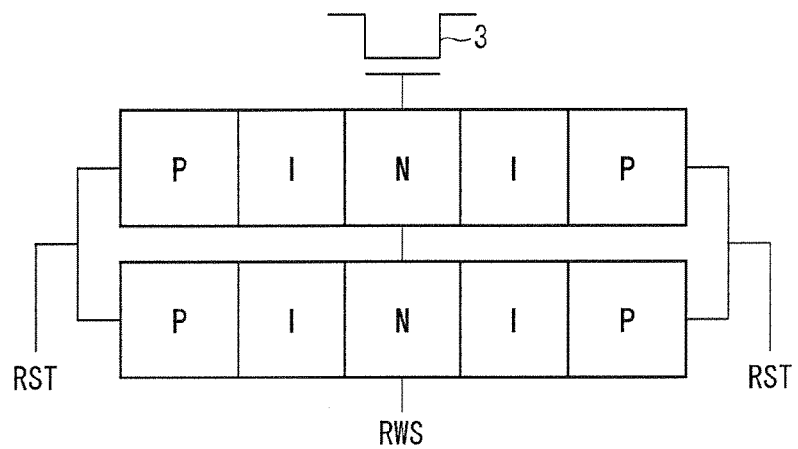

FIG. 13 is an explanation view showing an example in which a photodiode is made up of plural groups each including two photodiodes provided in a single Si island, the plural groups being connected to one another in parallel.

FIG. 14

Figure 14:
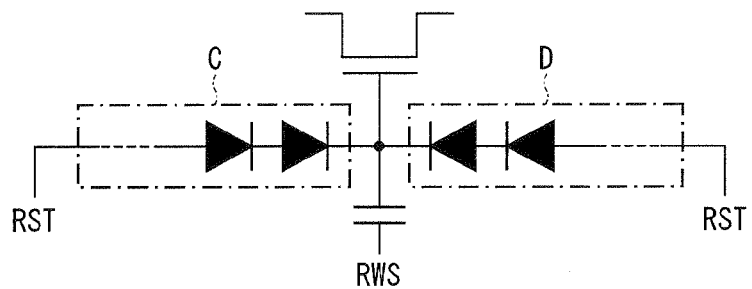

FIG. 14 is a circuit diagram showing an example in which a photodetector circuit employs a photodiode including two groups of photodiodes, the two groups of photodiodes being connected to each other in parallel and consisting of respective pluralities of photodiodes that are connected to one another in series.

FIG. 15

Figure 15:
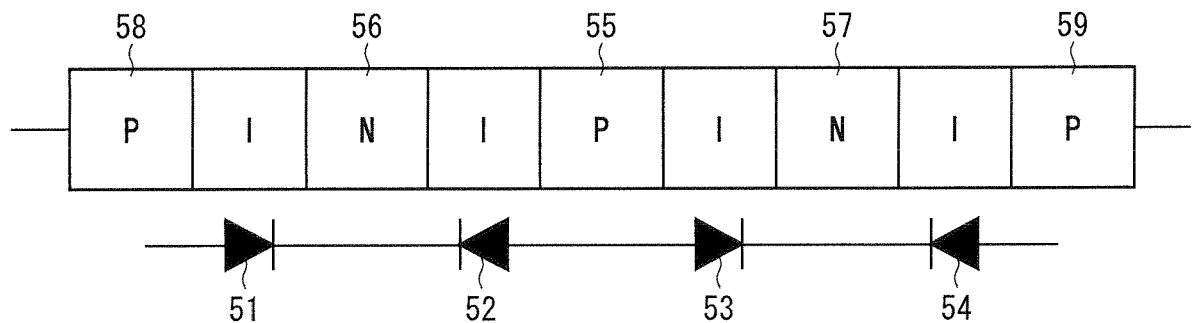

FIG. 15 is an explanation view showing an example in which a photodiode includes a four photodiodes in one Si island, the four photodiodes in one Si island being laid out linearly and connected to one another in parallel.

FIG. 16

Figure 16:
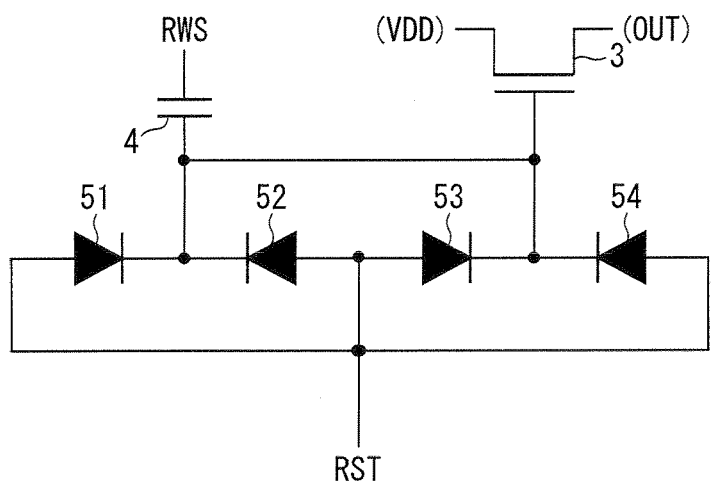

FIG. 16 is a circuit diagram showing a configuration of a photodetector circuit employing the photodiode shown in FIG. 15.

FIG. 17

Figure 17:
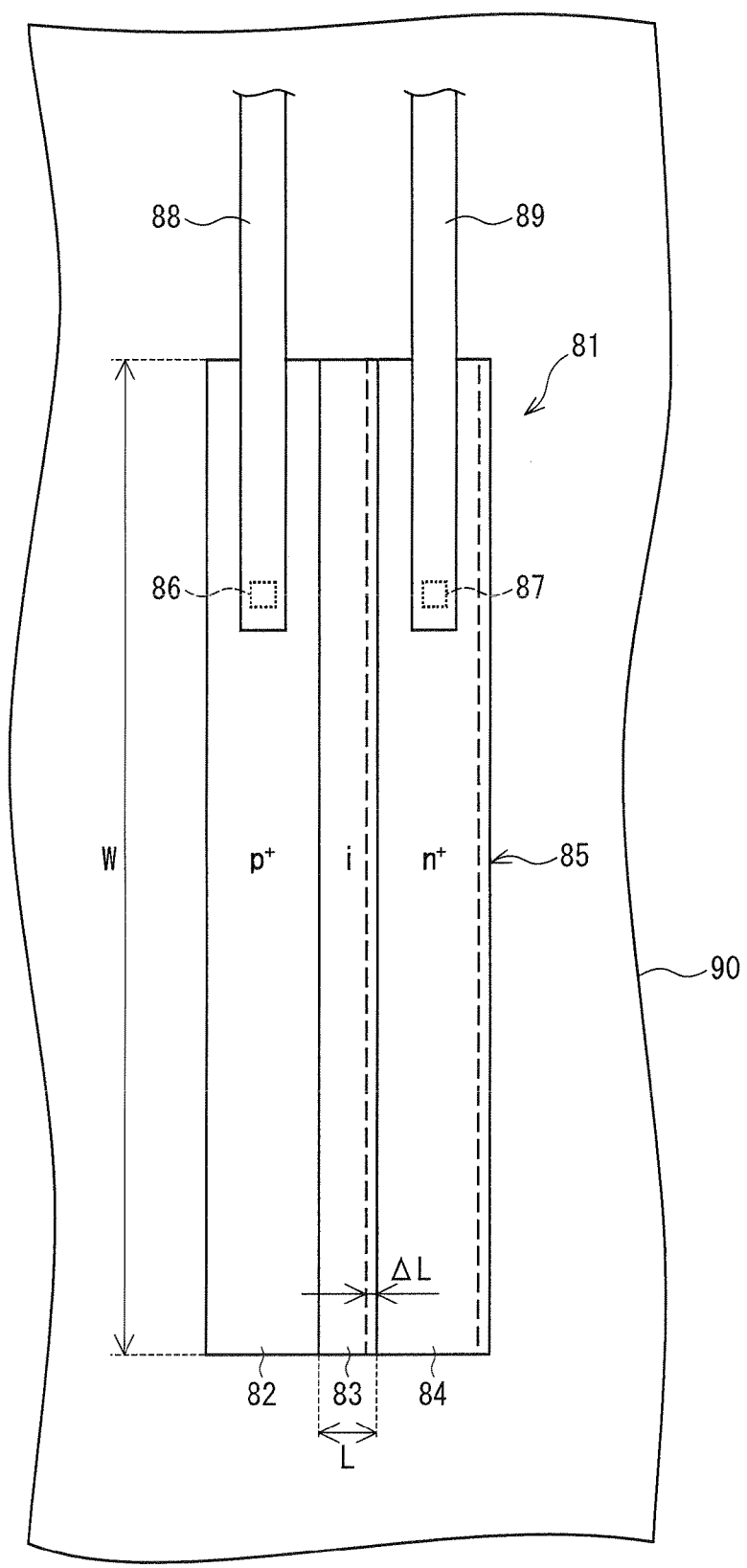

FIG. 17 is a plan view schematically showing one example of layouts of a displaying circuit and a photodetector circuit, each for constituting a pixel circuit being provided in one of pixels of a conventional display device.

FIG. 18

FIG. 18 is graph showing a characteristic curve indicative of a relation between (i) a photocurrent, which is generated when a photodiode receives incident light, and (ii) a channel length.

BRIEF DESCRIPTION OF REFERENCE NUMERALS 1 photodiode (one of N photodiodes, first diode)
1a P-type semiconductor region
1b channel region
1c N-type semiconductor region
2 photodiode (another one of N photodiodes, second diode)
2a n-type semiconductor region
2b channel region
2c P-type semiconductor region
3 TFT (another element)
4 integral capacitor (another element)
5 reference diode
5a P-type semiconductor region (first semiconductor region)
5b channel region 5c N-type semiconductor region (second semiconductor region)
10 display device
18b photodetector circuit
31 integral capacitor (another element)
35R sub-pixel
35G sub-pixel
35B sub-pixel
40 photodiode
41 photodiode
51 first photodiode
52 second photodiode
53 third photodiode
54 fourth photodiode
C closing line (first group of diodes that including diodes being connected to one each other in series)
D closing line (second group of diodes which consists of diodes being connected to one another in series)
L channel length
M1 TFT (another element)
W channel width (reference channel width)

DESCRIPTION OF EMBODIMENTS

First Embodiment

One embodiment of the present invention is described below with reference to the drawings. For convenience, each of the drawings referred to below simplifies and shows only main members out of members constituting one embodiment of the present invention. Such main members are necessary for describing the present invention. Dimensions of the members shown in the drawings do not accurately represent actual dimensions of the constituting members or their dimensional ratios. The same is true for the other embodiments to be later discussed.

(a) and (b) of FIG. 1 show examples of respective photodetector circuits which carry out equivalent operations. (a) of FIG. 1 shows a photodetector circuit with diodes of the present invention. (b) of FIG. 1 shows a photodetector circuit with a conventional diode.

(Reference Diode)

A photodiode 5 shown in (b) of FIG. 1 has: a p-type (first polarity) semiconductor region 5a (first semiconductor region); a channel region 5b, which is an intrinsic semiconductor region (semiconductor region relatively low in impurity concentration); and an N-type (reverse polarity to the first polarity) semiconductor region 5c (second semiconductor region), which is relatively high in impurity concentration. The P-type semiconductor region 5a and the channel region 5b are in contact with each other, and the N-type semiconductor region 5c and the channel region 5b are in contact with each other. The P-type semiconductor region 5a, the channel region 5b, and the N-type semiconductor region 5c are arranged, in this order, in a certain direction in a substrate plane.

As later described, the photodiode 5 carries out an equivalent operation with that of a combination of photodiodes 1 and 2 shown in (a) of FIG. 1 (the photodiodes of the present invention), and has a channel width W and a channel length L which will become references for channel widths and channel lengths of the photodiodes 1 and 2. On this account, the photodiode 5 shown in (b) of FIG. 1 is hereinafter referred to as a reference diode 5.

The certain direction is a direction in which the following constituents of a diode are arranged: one of impurity semiconductor regions; a channel region; and the other of impurity semiconductor regions. A diode of the present invention is made up of N diodes (where N is an even number of 2 or larger), each having one of impurity semiconductor regions, a channel region, and the other of impurity semiconductor regions which are arranged in a direction parallel to the certain direction. Derails regarding this are later described.

In case of assuming a configuration in which photodetector circuits are provided in a matrix manner on a substrate, the certain direction is, for example, parallel to a row direction and orthogonal to a column direction. Thus, the certain direction is parallel to a reset signal line 8 (described later) or a row selection signal line 9 (later describe) which is provided in parallel to the row direction, and is orthogonal to a power supply line 6 or an output signal line 7 which is provided in parallel to the column direction. Note, however, that this is merely illustrative. In case of disregarding a layout of the certain direction in relation to other lines or elements, it is possible to specify the certain direction in any direction.

In a case where the reference diode 5 receives light having an identical intensity, the reference diode 5 generates a photocurrent having an intensity in proportion to a channel width W (which corresponds to a reference channel width W) and a channel length L. That is, in the reference diode 5, a photodetection characteristic (I-V characteristic indicative of a relation between a diode current and a voltage applied across a diode), has a linear relation to the channel width W and the channel length L. In other words, each of the channel width W and the channel length L is selected from a range where it shows a linear change or a change which can be considered to be linear with respect to the I-V characteristic.

With regard to this, the following description further discusses with reference to FIG. 18 which shows the relation between the photocurrent and the channel length. In a case where the channel length L of the reference diode 5 is set to a channel length L0 shown in FIG. 18, the channel length L0 is in a range where the photocurrent has a linear change with respect to the channel length, whereas a channel length Lp is clearly not in such range.

Note that the channel length L can be selected from a range where 0<L<Lp or a range where Lp<L. In a case where the channel length L is selected from the range where Lp<L, the photocurrent is increased as the channel length L is decreased, and is decreased as the channel length L is increased. This is in contrast to a case in which the channel length L is selected from the range where 0<L<Lp.

(Electric Characteristic of Two-Segment Diode)

The photodetector circuit shown in (a) of FIG. 1 includes two photodiodes 1 and 2. The photodiode 1 has: a P-type semiconductor region 1a; a channel region 1b, which is an intrinsic semiconductor region; and an N-type semiconductor region 1c. The P-type semiconductor region 1a and the channel region 1b are in contact with each other, and the N-type semiconductor region 1c and the channel region 1b are in contact with each other. The P-type semiconductor region 1a, the channel region 1b, and the N-type semiconductor region 1c are arranged, in this order, along the certain direction.

Similarly to the photodiode 1, the photodiode 2 has: an N-type semiconductor region 2a; a channel region 2b, which is an intrinsic semiconductor region; and a P-type semiconductor region 2c. The N-type semiconductor region 2a and the channel region 2b are in contact with each other, and the P-type semiconductor region 2c and the channel region 2b are in contact with each other. The N-type semiconductor region 2a, the channel region 2b, and the P-type semiconductor region 2c are arranged, in this order, along the certain direction.

The regions 1a through 1c and the regions 2a through 2c have sizes in respective directions parallel to the certain direction, which are identical with sizes of the corresponding regions 5a through 5c of the reference diode 5 in the direction parallel to the certain direction.

The present embodiment meets the following requirement: the photodiodes 1 and 2 should have smaller channel widths than the channel width W of the reference diode 5. More specifically, the channel widths of the photodiodes 1 and 2 are set to W/2, under a condition that the I-V characteristic of the reference diode 5 has a relation which can be considered to be linear with respect to the channel width W and the channel L.

As shown in (a) of FIG. 1 and FIG. 5, the photodiodes 1 and 2 are also configured so that: the N-type semiconductor regions 1c and 2a, which have the identical polarity, are electrically connected to each other; and the P-type semiconductor regions 1a and 2c, which have the identical polarity, are electrically connected to each other. Thus, the photodiodes 1 and 2 are electrically connected to each other in parallel.

Since the photodiodes 1 and 2 are thus electrically connected to each other in parallel, an identical voltage is applied across each of them. Such an identical size of a voltage is applied across the reference diode 5. Each of the photodiodes 1 and 2 has the channel width which is a half width of the channel width W of the reference diode 5. Therefore, in a case where the photodiodes 1 and 2 receive light having an identical intensity with that of light received by the reference diode 5, each of the photodiodes 1 and 2 generates a photocurrent having an intensity which is half (I/2) intensity of a photocurrent (intensity I) generated by the reference diode 5.

As such, the photodiodes 1 and 2 electrically connected to each other in parallel generate respective photocurrents, whose intensities amount to the same intensity as that of the photocurrent (intensity I) generated by the reference diode 5. In this regard, the photodiodes 1 and 2, in combination, carry out an operation equivalent with that of the reference diode 5.

(Layout of Two-Segment Diodes)

The following description discusses layouts (an arrangement relation) of the regions 1a through 1c of the photodiode 1 and the regions 2a through 2c of the photodiode 2 on the substrate.

The regions 1a through 1c and the regions 2a through 2c are provided on the substrate so as to (i) extend in the respective directions parallel to the certain direction and so as to have a line-symmetric or point-symmetric arrangement relation as a whole. In other words, in case of FIG. 1, the regions 1a through 1c and the regions 2a through 2c have a line-symmetric (mirror-symmetric) arrangement relation.

In yet other words, a bias direction (a direction headed from the P-type semiconductor region 1a to the N-type semiconductor region 1c) obtained in a case where a forward bias voltage is applied across the photodiode 1, is reverse to a bias direction (a direction headed from the P-type semiconductor region 2c to the N-type semiconductor region 2a) obtained in a case where a forward bias voltage is applied across the photodiode 2.

Note that the layouts of the photodiodes 1 and 2 are merely required to be parallel to the certain direction, and it is therefore not necessary that the photodiodes 1 and 2 are arranged linearly to each other on a same line, as shown in (a) of FIG. 1. For example, even in a case where the photodiodes 1 and 2 are arranged on respective parallel lines which are spaced apart from each other and parallel to the line direction, they still have a point-symmetric arrangement relation. This meets the arrangement of the present invention.

By employing the arrangement, it is possible to stably manufacture diodes each having a same I-V characteristic as that of the reference diode 5, even in a case where there occurs positional displacement of (i) a mask (later described), with which P-type semiconductor regions are formed at once and/or (ii) a mask (later described), with which N-type semiconductor regions are formed at once.

This is because, for example, even in a case where the channel length L of the photodiode 1 is reduced by $\Delta L$ to be La due to the positional displacement of the mask with which the N-type semiconductor regions are formed at once, the channel length L of the photodiode 2 is increased by $\Delta L$ to be Lb (see (a) of FIG. 1). That is, according to the present invention, even in the case where there occurs positional displacement of a mask, a reduction in the channel width L of the photodiode 1 is thus offset by an increase in the channel length L of the photodiode 2. In other words, a channel length, obtained by averaging the channel length La thus reduced and the channel length Lb thus increased, is identical to the channel length L as originally designed.

In the above case, the photodiode 1 has a reduction in photocurrent and the photodiodes 2 has an increase in photocurrent so that the reduction is compensated by the increase. Therefore, regardless of positional displacement of a mask, the photodiodes 1 and 2 generates photocurrents, which in combination are identical in intensity with that of a photocurrent generated by the reference diode 5.

Thus, in a photodetector circuit employing the photodiodes of the present invention thus configured, there is no individual difference among I-V characteristics (light receiving characteristics) of the respective photodiodes, and it is therefore possible to obtain a desired I-V characteristic of a photodiode in each of the photodiodes.

In contrast, according to the reference diode 5, in a case where positional displacement of a mask occurs as shown in (b) of FIG. 1, the channel length of the reference diode 5 is simply reduced from L to Lc. Such reduction in the channel length results in a change in the light receiving characteristic of the reference diode 5. Thus, an I-V characteristic of the reference diode 5 is changed from one reference diode 5 to another.

(Display Device Including Photodetector Circuit)

A display device of the present invention includes a photodetector circuit employing photodiodes whose layouts have a symmetrical arrangement.

The following description discusses a schematic configuration of the display device. As shown in FIG. 2, a display device 10 of the present embodiment includes a transparent substrate 12 on which all circuit elements constituting various drivers and pixels are integrated. The transparent substrate 12 is made of, for example, glass.

Note that all the circuit elements are monolithically provided on the transparent substrate 12. The term "monolithically provided" indicates that the elements are provided directly onto the glass substrate by a physical process and/or a chemical process, while excluding meaning that the mounting of semiconductor circuits on the glass substrate.

The display device 10 includes an active matrix region 13, a source driver 14, a gate driver 15, a sensor line driver 16, and a sensor reading driver 17.

In the active matrix region 13, source lines and scanning lines are provided in a matrix manner, and at each of intersections of the source lines and the scanning lines, there are provided well-known elements for constituting a corresponding pixel, which include a pixel electrode and a switching element for driving the corresponding pixel. Also, a photodetector circuit is provided in each pixel.

The source driver 14 transmits display signals via the respective source signal lines, and the gate driver 15 transmits pixel selection signals to pixels via the respective scanning signal lines.

The sensor row driver 16 selectively drives the photodetector circuits row by row. The sensor reading driver performs: applying a power supply voltage VDD of a certain electric potential to the photodetector circuits; and reading photodetection signals of the photodetector circuits.

FIG. 3 shows a configuration of a pixel circuit 18 provided in one of the pixels constituting the active matrix region 13. The pixel circuit 18 includes a display circuit 18a and a photodetector circuit 18b. Note that although the displaying circuit 18a is provided for each pixel, the photodetector circuit 18b is not necessarily provided for each pixel. By taking into account a resolution required for photodetection, the photodetector circuit 18b may be provided only for a pixel (e.g., every predetermined number of pixels) in which a corresponding one of the photodetector circuit 18b is required to be provided.

The displaying circuit 18a is provided at or in vicinity of each of the intersections of the source lines 21 and the gate signal lines 22 which are provided lengthwise and breadthwise (in a column direction and a row direction), respectively. The displaying circuit 18a includes: a thin film transistor (hereinafter referred to as TFT) 23; a liquid crystal capacitor 25, which is connected between (i) a pixel electrode connected to one end of the TFT 23 and (ii) a common electrode 24 provided so as to face the pixel electrode; and a storage capacitor 27, which is connected between a common signal line 26 and the pixel electrode.

The photodetector circuit 18b, on the other hand, is configured so as to be a circuit of 1T type (where "T" of 1T stands for a transistor) which includes one transistor. A TFT:M1 (which corresponds to a TFT 3 shown in FIG. 1) functions as a source follower transistor (voltage follower transistor). The TFT:M1 has a drain connected to a power supply line 28 (which corresponds to the power supply line 6 shown in FIG. 1) and a source connected to an output signal line 29 (which corresponds to the output signal line 7 shown in FIG. 1). Both the power supply line 28 and the output signal line 29 are connected to the sensor reading driver 17. Thus, the power supply voltage VDD is supplied from the sensor reading driver 17 to the power supply line 28.

The TFT:M1 has a gate, which is connected to cathodes (third electrodes) of the respective photodiodes 1 and 2 (the photodiodes 1 and 2 in combination are equivalent to the reference diode 5, and are hereinafter referred to as a photodiode 30), and to one end (second electrode) of an integral capacitor 31 (which corresponds to an integral capacitor 4 shown in FIG. 1) which is connected to the photodiode 30 in series.

The photodiode 30 has anodes (fourth electrodes) which are connected to a reset signal line (initialization signal input line) 32 via which a reset signal RST is transmitted by the sensor row driver 16. An integral capacitor 31 has the other end (first electrode) which is connected to a row selection signal line (selection signal input line) 33 via which a row selection signal RWS is transmitted. Note that the row selection signal RWS has a function of: selecting photodetector circuits belonging to a corresponding specific one of the lines which are provided in a matrix manner; and causing the photodetector circuits belonging to the corresponding specific one of the lines to output respective detection signals.

(Process for Manufacturing Photodetector Circuit)

In the present embodiment, a same step of a process concurrently carries out (i) providing a silicon film for forming the photodiode 30 and (ii) providing, on the transparent substrate 12 a silicon film for forming an active element such as the TFT:M1. The regions 1a through 1c and the regions 2a through 2c are formed by use of a step (ion implantation step) of forming a P-type or N-type semiconductor region which constitutes (i) circuit elements of the source driver 14, the gate driver 15, the sensor row driver 16, and the sensor reading driver 17 and/or (ii) the active element.

For example, the N-type semiconductor region 1c and the N-type semiconductor region 2a can be formed in the step (ion implantation step) of forming an N-type semiconductor region of the active element. In a case where the N-type semiconductor region of the active element is provided by carrying out a plurality of ion plantation steps in which a condition under which the N-type semiconductor region of the active element is provided differs from a conduction under which the N-type semiconductor regions 1c and 2a are provided, an ion implantation step best suitable for the formation of the N-type semiconductor regions 1c and 2a is selected from the plurality of the ion implantation steps.

Each of the channel regions 1b and 2b is formed so as to be electrically closer to a neutral state, as compared to its adjacent impurity semiconductor regions. For example, the channel regions 1b and 2b can be formed by providing, at time when carrying out ion implantation for forming the N-type semiconductor regions 1c and 2a or ion implantation for forming the P-type semiconductor regions 1a and 2c, masks on respective regions to form the channel regions 1b and 2b. If the silicon films having been formed are not electrically neutral, then the channel regions 1b and 2b can be formed by carrying out ion implantation with respect to regions to form the respective channel regions 1b and 2b.

The silicon films can be formed by: an amorphous silicon film; or a polysilicon film or a continuous grain silicon (CGS) film. Note, however, that in the present embodiment, all the circuit elements are monolithically formed on the transparent substrate 12. In view of an electron mobility, it is preferable that the silicon films be formed by the polysilicon film or the CGS film. Particularly, it is preferable that the silicon films be formed by the CGS film having a greatest electron mobility.

(Operation of Photodetector Circuit; Light State)

With reference to FIG. 4, the following description discusses how the photodetector circuit 18b operates. At first, the sensor row driver 16 supplies a high level of a reset signal RST via the reset signal line 32 so as to reset a gate electric potential VINT of the TFT:M1. This causes a forward bias voltage to be applied across the photodiode 30 during a reset period (t1 to t2). As such, the integral capacitor 31 is charged, and the gate electric potential VINT gradually rises and ultimately reaches an initialization electric potential ($V_{DDR}$).

After the gate electric potential VINT has reached the initialization electric potential, the reset signal RST is switched to a low level. This causes the photodiode 30 to have a cathode electric potential higher than an anode electric potential, and therefore, a reverse voltage is applied across the photodiode 30. In this situation, the gate electric potential VINT becomes equal to a value obtained by subtracting, from the initialization electric potential ($V_{DDR}$), (i) a forward voltage drop (VF) of the photodiode 30 and (ii) a voltage drop ($\Delta V_{RST}$) due to a parasitic capacitance of the photodiode 30.

In this state, when the photodiode 30 receives light during a photodetection period (t2 to t3), a photocurrent due to the reverse bias voltage flows in the photodiode 30. Note that the photocurrent flowing in the photodiode 30 varies depending on an intensity of the light. Such photocurrent flow causes electric charge stored by the integral capacitor 31 to be discharged via the reset signal line 32. As such, the gate electric potential VINT is gradually decreased, and ultimately decreased to a detected electric potential corresponding to the light intensity.

The photodetection period is followed by a reading period, i.e., a detection signal reading period (t3 to t4), during which a photodetection result is read out. Then, the sensor row driver 16 supplies a high level of a row selection signal RWS to the other end of the integral capacitor 31 via the row selection signal line 33. This causes a rapid increase in the gate electric potential VINT via the integral capacitor 31, so that the gate electric potential reaches an electric potential (for example, an electric potential V1 shown in FIG. 4) which is equal to a sum of the detected electric potential and an electric potential corresponding to the high level of the row selection signal RWS.

Note that the electric potential V1 shown in FIG. 4 corresponds to a bright state obtained in a case where the gate electric potential VINT is dropped to a lowest level at t3 after the photodiode 30 receives light having a high intensity.

The gate electric potential VINT reaches above a threshold voltage in response to the rapid increase. This causes the TFT:M1 to be turn on. Accordingly, a voltage, which is amplified in accordance with a gain that varies depending on the gate electric potential VINT (i.e., intensity of the light), is outputted from the source of the TFT:M1. The voltage is transmitted, as a detection signal (e.g., in FIG. 4, VPIX corresponding to a bright state), from the source of the TFT:M1 to the sensor reading driver 17 via the output signal line 29.

(Operation of Photodetector Circuit; Dark State)

When receiving no light during the photodetection period (t2 to t3), the photodiode 30 generates no photocurrent. This causes the gate electric potential VINT to be substantially kept to the initialization electric potential. Note, however, that the gate electric potential VINT becomes a detection signal slightly smaller than the initialization electric potential due to generation of a small leak current.

The photodetection period is followed by the detection signal reading period (t3 to t4). During the detection signal reading period, as in the case with the bright state, a rapid increase in the gate electric potential VINT is caused via the integral capacitor 31. Thus, the gate electric potential VINT reaches an electric potential (for example, an electric potential V2 shown in FIG. 2) which is nearly equal to a sum of the initialization electric potential and an electric potential corresponding to the high level of the row selection signal RWS.

In this situation, the detection signal (for example, VPIX corresponding to the dark state shown in FIG. 4) output by the TFT:M1 becomes maximum.

Thus, the detection signal is generated in such a manner that a level of the detection signal varies depending on an intensity of the light received by the photodiode 30. Note that the detection signal is generated in a pixel in which the photodetector circuit 18b is provided. It is therefore possible to carry out detecting operations with respect to an object to be detected which is disposed closely to the display screen, by use of a backlight device included as a displaying light source in the display device 10 shown in FIG. 10. The detecting operations can be reading of coordinates of the object or reading of the object itself such as a character or fingerprint, wherein such reading is performed on the display screen.

Note that the photodetector circuit 18b is constituted by elements which are very few in number, as compared to a conventional CMOS photodetector circuit later described with reference to (a) of FIG. 7. As such, an area occupied by the photodetector circuit 18b is reduced in each pixel. The photodetector circuit 18b of the 1T type is very advantageous for the purpose of an increase in pixel aperture rate. Also, since the number of the elements is small, the photodetector circuit 18b has a smaller self-parasitic capacitance. This is capable of increasing response speed of the detecting operations, and allows for an improvement to a problem that a dynamic range is narrowed due to a pull-in caused by a parasitic capacitance.

Thus, in case of arranging display devices so that each pixel includes a photodetector circuit of 1T type realized by use of photodiodes of the present invention, it is possible provide excellent display devices (i) which suffer no problem in that a photodetection accuracy in a display device differs from one display device to another, (ii) in any of which a desired detecting characteristic can be obtained, and (iii) which carries out bright display.

(Layout Example of Photodetector Circuit in Pixel)

With reference to FIG. 6, the following description discusses one layout example of elements which is made with respect to a case in which the photodetector circuit 18b is provided in a pixel of a liquid crystal display device for carrying out full-color display.

FIG. 6 is an enlarged plan view schematically showing the photodetector circuit 18b and its vicinity in one pixel which is made up of sub-pixels 35R, 35G, and 35B of three colors (i.e., red, green, and blue colors (RGB)).

Each of the sub-pixels 35R, 35G, and 35B includes a displaying circuit 18a, although this is not illustrated in FIG. 6. Source lines 21 are extended, in a column direction, between the sub-pixels 35R, 35G, and 35B which are adjacent to one another in a row direction. The source lines 21 convey display signals of the respective colors to TFTs 23 (see FIG. 3) which constitute the respective displaying circuits 18a.

Note that, according to the configuration example shown in FIG. 6, that one of the source lines 21 which is provided between the sub-pixels 35R and 35G serves also as the power supply line 28, and another one of the source lines 21 which is provided between the sub-pixels 35G and 35B also serves as the output signal line 29.

The photodetector circuits 18b are provided in one end parts of the respective sub-pixels 35R, 35G, and 35B which extend in the column direction. The one end parts of the respective sub-pixels 35R, 35G, and 35B are defined by (i) the reset signal line 32 and (ii) the row selection signal line 33, each extending orthogonal to the source signal line 21. Note that the reset signal line 32 and the row selection signal line 33 are provided so as to be away from each other, in the column direction, by a certain distance.

According to the configuration example shown in FIG. 6, (i) the TFT:M1, which constitutes the photodetector circuit 18b, is provided in the one end part of the sub-pixel 35G, and (ii) the photodiodes 1 and 2, which constitute the photodiode 30, are provided in the respective one end parts of the sub-pixels 35R and 35B.

According to the configuration example shown in FIG. 6, a line 36a, via which the gate of the TFT:M1 is connected to the cathode (N layer) of the photodiode 1, is further provided, for example, under that one of the source signal lines 21 which extends between the sub-pixels 35R and 35G. The row selection signal line 33 has an extension 37a which extends above the line 36a. The line 36a and the extension 37a partially overlap each other, and this forms an integral capacitance 31a which is a part of the integral capacitor 31.

Similarly, according to the configuration example shown in FIG. 6, a line 36b, via which the gate of the TFT:M1 is connected to the cathode (N layer) of the photodiode 2, is provided, for example, under another one of the source signal lines 21 which extends between the sub-pixels 35G and 35B. The row selection signal line 33 has an extension 37b which extends over the line 36b. The line 36b and the extension 37b partially overlap each other, and this forms an integral capacitance 31b which is a part of the integral capacitor 31. Note that the lines 36a and 36b can be made of, for example, Si.

The TFT:M1 has: a drain connected, via a contact section 38a, to that one of the source signal lines 21 which serves also as the power supply line 28; and a source connected, via a contact section 38b, to another one of the source signal lines 21 which serves also as the output signal line 29. The anode (P layer) of the photodiode 1 is connected, via a contact section 38c, to the reset signal line 32. The anode (P layer) of the photodiode 2 is connected, via a contact section 38d, to the reset signal line 32.

As shown in FIG. 6, the photodetector circuit 18b is constituted by elements which are very few in number, as compared to the conventional CMOS photodetector circuit shown in (a) of FIG. 7. It is clear from this that the photodetector circuit 18b contributes to an improvement in aperture rate, and therefore allows for bright display.

Note that a photodetector element, such as a thin film photodiode made of a low temperature poly silicon (LPS), has a characteristic which shows a relatively high sensitivity to blue light, whereas a relatively low sensitivity to red light. In a case where a photodetector element is provided in a red color pixel, such a characteristic causes a disadvantage of narrowing down a dynamic range due to a poor sensitivity, whereas gives rise to an advantage of improving a signal quality because the photodetector element detects no stray light directed toward a pixel. On the other hand, in a case where the photodetector element is provided in a blue color pixel, such a characteristic gives rise to an advantage of improving a dynamic range due to the good sensitivity, whereas causes a disadvantage of impairing the signal quality because the photodetector element is more likely to detect stray light.

According to the configuration shown in FIG. 6, since the photodetector element is provided in both the red and blue color pixels, there occur the advantages and the disadvantages described above. In this regard, the dynamic range and the signal quality are in good balance in a photodetector having the configuration shown in FIG. 6.

(Variation of Photodetector Circuit; 1T Type)

FIG. 7 shows variations of the photodetector circuit 18b. In any of photodetector circuit 61 shown in (a) through (c) of FIG. 7, it is possible to replace a photodiodes 62 with even-numbered photodiodes of the present invention which are arranged so as to be symmetrical to one another.

(c) of FIG. 7 shows a photodetector circuit of 1T type having a same configuration as that of the photodetector circuit 18b described earlier with reference to FIGS. 3, 4, and 6. Specifically, the constituents of the photodetector circuit shown in FIG. 3 and constituents of the photodetector circuit shown in (c) of FIG. 7 correspond to each other as follows.

Photodiode 30—Photodiode 62
Integral capacitor 31—Integral capacitor 63
TFT:M1—TFT 65 (source follower transistor)

(Variation of Photodetector Circuit; 3T Type)

(a) of FIG. 7 shows a conventional CMOS photodetector circuit of 3T type including three TFTs 64, 65, and 66. A photodiode 62 and an integral capacitor 63 are electrically connected to each other in parallel. An anode of the photodiode 62 and one terminal of the integral capacitor 63 are connected to ground. On the other hand, a cathode of the photodiode 62 and the other terminal of the integral capacitor 63 are connected to both a gate of the TFT 65 and a source of the TFT 64.

The TFT 64 has: a gate connected to a reset signal line 32 via which a reset signal RST is transmitted; and a drain connected to a power supply line 28 via which a power supply voltage VDD is supplied.

The TFT 65 has a source connected to the output signal line 29 via a drain and a source of the TFT 66. The TFT 66 has a gate connected to the row selection signal line 33 via which the row selection signal RWS is transmitted.

According to the circuit configuration, while the gate of the TFT 64 is receiving the reset signal RST, the integral capacitor 63 is charged by the power supply voltage VDD. This causes the gate electric potential VINT of the TFT 65 to be held at the initialization electric potential. In this situation, a reverse bias voltage is applied across the photodiode 62.

In this state, in case of receiving light, the photodiode 62 generates a photocurrent in accordance with an intensity of the incident light. As such, electric charge stored by the integral capacitor 63 is discharged. This causes the gate electric potential VINT of the TFT 65 to be reduced to an electric potential which varies depending on the intensity of the incident light.

Then, a detection signal reading period follows. During the detection signal reading period, the TFT 66 is turned on while the gate of the TFT 66 is receiving the row selection signal RWS. This causes the voltage, which varies depending on the gate electric potential VINT of the TFT 65, to be supplied to the output signal line 29 via the source of the TFT and the TFT 66. Specifically, the voltage becomes maximum in case of the dark state in which the intensity of the incident light is zero, and becomes minimum in case of the bright state in which the intensity of the incident light is sufficiently strong.

(Variation of Photodetector Circuit: 2T Type)

(b) of FIG. 7 shows a photodetector circuit of 2T type including two transistors. In the photodetector of 2T type, one constituent of the circuit configuration of the photodetector circuit of 3T type is removed. This intends to achieve an improvement in aperture rate.

In the photodetector circuit of 2T type, (i) the TFT 64, which is subjected to on/off control in response to the reset signal RST, is removed from the photodetector circuit of 3T type, and (ii) an integral capacitor 63 has one terminal (second electrode) connected to a gate of a TFT 65 and a cathode (third electrode) of a photodiode 62, and the other terminal (first electrode) connected to a power supply line via which a power supply voltage VDD is supplied. It is configured so that the photodiode 62 has an anode (fourth electrode) that receives the reset signal RST, as in the case with the photodiode 62 of 1T type.

That is, the photodetector circuit of 2T type includes:

(1) the TFT 65 and the TFT 66 connected to each other in series, (a) a power supply line via which a power voltage is supplied and (b) an output signal line via which a photodetection signal of a photodetector circuit is outputted being connected, via drain and source of the first transistor and via drain and source of the second transistor;

(2) the row selection signal line 9 via which the row selection signal RWS is inputted to a gate of the second transistor during the reading period of the photodetection signal;

(3) the reset signal line via which the reset signal RST is transmitted, the reset signal RST serving as (x) the first voltage which causes the forward bias voltage to be applied across the photodiode during the reset period of the photodiode 62 and (y) the second voltage which causes the reverse voltage to be applied across the photodiode 62 during the photodetection period; and the photodiode having the cathode which is connected to the gate of the first transistor and is connected to the power supply voltage line via the capacitor.

The following description discusses how the photodetector circuit of 2T type operates. First, in order that a gate electric potential VINT of the TFT 65 is reset, the anode of the photodiode 62 receives the high level of the reset signal RST which is equal to the power supply voltage VDD. This causes a forward bias voltage to be applied across the photodiode 62 during the reset period. Thus, the gate electric potential VINT reaches the initialization electric potential, which is equal to a value obtained by subtracting, from the power supply voltage VDD, a forward voltage drop across the photodiode 2.

After the gate electric potential VINT has reaches the initialization electric potential, the reset signal RST is changed to a low level (e.g., 0 V). This causes the photodiode 62 to have a cathode electric potential larger than an anode electric potential, and therefore a reverse bias voltage is applied across the photodiode 62. In this state, the photodiode 62 receives light during the photodetection period. During the photodetection period, a photocurrent, which varies depending on the intensity of the light, flows into the photodiode 62 across which the reverse bias voltage is applied. This causes the integral capacitor 63 to be charged by an electrical charge, so that the gate electric potential VINT reaches an electric potential which is lower than the power supply voltage by a voltage across the integral capacitor 31. That is, the gate electric potential VINT is decreased in accordance with the intensity of the light.

Thereafter, the photodetection period is followed by the detection signal reading period. Then, the gate of the TFT 66 receives a high level of the row selection signal RWS so that the TFT 66 turns on. This causes the TFT 66 to output via its source, as a detection signal, a voltage amplified in accordance with a gain which varies depending on the gate electric potential VINT, i.e., the intensity of the light.

The photodetector circuit of 2T type is thus constituted by the elements which are few in number, as compared to the photodetector circuit of 3T type. Therefore, the photodetector circuit of 2T type is advantageous for the purpose of an increase in pixel aperture rate.

Second Embodiment

Another embodiment of the present invention is described below, with reference to figures. Note that for convenience, constituents identical with those discussed in First Embodiment are given same reference numerals, and their overlapping explanations are omitted. This is also true for the other embodiments to be later discussed.

(First Layout of Semiconductor Region in Photodiode)

First Embodiment has dealt with the case in which the photodiodes 1 and 2 are provided in respective separate Si islands, as shown in FIG. 6. Second Embodiment, on the other hand, deals with a case in which two photodiodes are provided in a single Si island.

(a) of FIG. 8 shows a photodiode 40 which is equivalent to the photodiodes 1 and 2 shown in FIG. 5. According to the photodiodes 1 and 2 shown in FIG. 5, the N-type semiconductor regions 1c and 2a are respective separate regions which are electrically connected to each other. According to the photodiode 40, on the other hand, photodiodes 1 and 2 share N-type semiconductor regions 1c and 2a.

Even in case of providing the two photodiodes in the single Si island, it is possible to (i) arrange them on a substrate so that their semiconductor regions have a line-symmetric or point-symmetric arrangement relation as a whole, and to (ii) cause the two photodiodes in combination to carry out an identical operation with that of a reference diode.

According to the configuration, an area occupied by the two photodiodes can be reduced on the substrate, as compared to the configuration in which the two photodiodes are provided in the respective separate Si islands. Thus, the configuration is advantageous, in a case where the two photodiodes are provided in one pixel (e.g., one of sub-pixels 35R and 35B), for the purpose of a reduction in pixel size or an improvement in pixel aperture rate.

(Second Layout of Semiconductor Regions in Photodiode)

(b) of FIG. 8 shows a photodiode 41 having a configuration in which two photodiodes share a P-type semiconductor region.

The photodiodes 40 and 41 are different from each other in that a P-type semiconductor region and an N-type semiconductor region are arranged in a reverse order. However, both the photodiodes 40 and 41 are subjected to wire lining which causes a P-type semiconductor region for an anode to receive a rest signal RST, and an N-type semiconductor region for a cathode to be connected to an integral capacitor. Thus, each of the photodiodes 40 and 41 carries out a completely equivalent operation.

FIG. 9 is a circuit diagram showing a circuit configuration in which the photodiode 41 is provided in place of the photodiodes 1 and 2 shown in Fig. (a) of FIG. 1.

That is, the photodetector circuit shown in FIG. 9 includes:

(1) a TFT 3, via whose drain and source, (i) a power supply line 6 via which a power voltage VDD is supplied and (ii) an output signal line 7 via which a photodetection signal of the photodetector circuit is outputted are connected to each other;

(2) a selection signal line 9 via which a row selection signal RWS is transmitted so as to cause a rapid increase in a gate electric potential of the TFT 3 via a capacitor, during a reading period of the photodetection signal; and (3) a reset signal line 8 via which a reset signal RST is transmitted, the reset signal RST serving as (i) a first voltage which causes a forward voltage to be applied across a photodiode 41 during a reset period of the photodiode 41 and (ii) a second voltage which causes a reverse voltage to be applied across the photodiode 41 during a photodetection period.

According to the configuration shown in FIG. 9, it is further configured, in addition to the configurations (1) through (3) so that (4) the photodiode 41 includes: a first photodiode which has a cathode connected to a conductive node connecting the row selection signal line 9 and the gate of the TFT 3 via a first capacitor CINT serving as the capacitor, and an anode connected to the reset signal line 8; and a second photodiode which has a cathode connected to a conductive node connecting the row selection signal line 9 and the gate of the TFT 3 via a second capacitor CINT serving as the capacitor, and an anode connected to the reset signal line 8.

(First Layout of Photodetector Circuit)

FIG. 10 shows one layout example of a photodiode in which the photodiode 40 is provided in one pixel (e.g., any one of sub-pixels 35R, 35G, and 35B).

A TFT:M1 has: a drain connected to that one of source signal lines 21 which serves also as a power supply line 28; a source connected to another one of source signal lines 21 which serves also as an output signal line 29; and a gate connected to the N-type semiconductor region of the photodiode 40.

From the N-type semiconductor region of the photodiode 40, an electrode 42 extends toward a row selection signal line 33 extending parallel to a foregoing certain direction in which the semiconductor regions of the photodiode 40 are arranged.

The electrode 42 and a row selection signal line 33 partially overlap each other, and this forms integral capacitors 31.

Connection lines are provided so as to bridge between (i) P-type semiconductor regions at respective ends of the photodiode 40 and (ii) a reset signal line 32 extending parallel to the row selection signal line 33. Note that the connection lines are located above the row selection signal line 33.

(Second Layout of Photodetector Circuit)

FIG. 11 shows one layout example of a photodetector circuit in which the photodiode 41 is provided in a single pixel (e.g., any one of the sub-pixels 35R, 35G, and 35B).

As in the case with FIG. 10, a TFT:M1 has: a drain connected to that one of the source signal lines 21 which serves also as the power supply line 28; and a source connected to another one of the source signal lines 21 which serves also as the output signal line 29. Note that the TFT:M1 has a gate from which an electrode 43 of two-pronged type extends so as to be connected to N-type semiconductor regions at respective ends of the photodiode 41.

The electrode 43 further extends toward the row selection signal line 33, via the N-type semiconductor regions. The row selection signal line 33 and the electrode 43 partially overlap each other, and this forms integral capacitances 31.

A connection line is provided so as to bridge between (i) the reset signal line 32 and (ii) the P-type semiconductor region of the photodiode 40. Note that the connection line is located above the row selection signal line 33.

Third Embodiment

A further embodiment of the present invention is described below with reference to the drawings.

As shown in FIG. 12, a photodiode of the present embodiment is made up of N photodiodes connected to one another in parallel, where N is an even number of 4 or greater. Specifically, the N photodiodes have respective cathodes electrically connected to one another, and respective anodes electrically connected to one another. Note that, as in the case with the photodetector circuit shown in (a) of FIG. 1, the cathodes are each connected to a gate of a TFT 3, and the anodes each receive a reset signal RST.

Each of the N photodiodes has a channel width selected from a range where an I-V characteristic shows, as discussed earlier, a change which can be considered to be linear with respect to the channel width. Thus, each of the N photodiodes has a channel length L identical to that of the reference diode 5, and a channel width which is equal to 1/N of the channel width W of the reference diode 5 (i.e., a channel width of W/N). The N diodes each having the channel width and the channel length above are electrically connected to one another in parallel, so as to carry out, in combination, the equivalent operation with that of the reference diode 5.

The following description discusses layouts of the N photodiodes on a substrate. As shown by a closing dashed line B of FIG. 12, two of the N photodiodes constitutes one group of photodiodes. Plural group (N/2 group) of photodiodes are arranged in a longitudinal direction. A bias direction obtained in one of two photodiodes in one group of photodiodes is reverse to a bias direction obtained in the other one of two photodiodes in one group of photodiodes. The two photodiodes in one group of photodiodes have respective cathodes facing each other.

Each of the N photodiodes has semiconductor regions arranged on a substrate as follows. The semiconductor regions of each of the N photodiodes extend in respective directions parallel to a foregoing direction, and semiconductor regions of one of two photodiodes in any one group of photodiodes and semiconductor regions of the other one of two photodiodes in any one group of photodiodes have a line-symmetric or point-symmetric arrangement relation as a whole.

As such, even in a case where there occurs positional displacement of a mask used during an impurity ion implantation step in preparing of N photodiodes on the substrate, cancellation of changes in characteristics is resulted between the two photodiodes in any one group of photodiodes. It is therefore possible to stably manufacture one groups of photodiodes which have same characteristic with that of the reference diode 5.

FIG. 13 shows an example in which two groups of photodiodes, each including two photodiodes provided in a single Si island (see FIG. 8), are connected to each other in parallel.

Fourth Embodiment

Still a further embodiment of the present invention is described below with reference to figures.

A relation of N photodiodes, which constitutes a photodiode shown in FIG. 14, to a foregoing certain direction is completely identical with the other relations discussed so far. Specifically, the N photodiodes have their semiconductor regions which are arranged on a substrate so as to extend parallel to the certain direction, and have a line-symmetric or point-symmetric arrangement relation as a whole.

In addition to the above, the N photodiodes include a first group of N/2 photodiodes (see a closing dashed line C) which are electrically connected to one another in series, and a second group of N/2 photodiodes (see a closing dashed line D) which are electrically connected to one another in series. The first group of N/2 photodiodes and the second group of N/2 photodiodes are electrically connected to each other in parallel.

Photodiodes, one of which is provided at one end of the first group of N/2 photodiodes and the other one of which is provided at one end of the second group of N/2 photodiodes, have respective cathodes each connected to a connecting node that connects a row selection signal line 9 and a gate of a TFT 3 via an integral capacitor 4. On the other hand, photodiodes, one of which is provided at the other end of the first group of N/2 photodiodes and the other one of which is provided at the other end of the second group of N/2 photodiodes, have respective anodes each connected to a reset signal line 8.

Note that a channel width is selected from a range where an I-V characteristic of the photodiode changes, in a form which can be considered to be linear, in response to a change in the channel width. Thus, each of the N photodiodes has a channel width equal to W/2. The reason for this is described as follows.

In a case where N/2 photodiodes, each having the channel width of W/2, are electrically connected to one another in series, a voltage applied across each of the N/2 photodiodes is reduced to 2/N of a voltage applied across the entire N/2 photodiodes (2/N of a voltage applied across the entire N/2 photodiodes is a product of a voltage applied across the entire N/2 photodiodes by an inverse number, i.e., 2/N, of the number of the N/2 photodiodes electrically connected to one another in series). Thus, an I-V characteristic of the photodiode, which is made up of the N/2 photodiodes electrically connected to one another in series, is identical with an I-V characteristic of each of the N/2 photodiodes.

Based on the above fact, it is configured so that the first group of N/2 photodiodes and the second group of N/2 photodiodes are electrically connected to each other, and that both the first group of N/2 photodiodes and the second group of N/2 photodiodes have the channel widths of W/2. If the photodiode thus made up of the first group of N/2 photodiodes and the second group of N/2 photodiodes is examined in terms of its I-V characteristic, it is demonstrated that the I-V characteristic of such photodiode is identical with an I-V characteristic of a combination of two photodiodes, which are configured to have a channel width of W/2 and are connected to each other so as to be equivalent in I-V characteristic with a reference diode.

Fifth Embodiment

Yet another embodiment of the present invention is described below, with reference to the drawings A photodiode shown in FIG. 15 is made up of four photodiodes provided in a single Si island, and is thus advantageous for the purpose of a reduction in area occupied by these photodiodes on a substrate. More specifically, the photodiode is configured as discussed in the following (1) through (7).

(1) The four photodiodes include a first photodiode 51, a second photodiode 52, a third photodiode 53, and a fourth photodiode 54, which are arranged, in this order, in a foregoing certain direction. The second photodiode 52 and the third photodiode 53 share, for example, a P-type semiconductor region (first semiconductor region) 55.

(2) The second photodiode 52 and the fourth photodiode 54 have equivalent configurations. The fourth photodiode 54 and the third photodiode 53 are connected to each other in series in the certain direction.

(3) The first photodiode 51 and the third photodiode 53 have equivalent configurations. The first photodiode 51 and the second photodiode 52 are connected to each other in series in the certain direction.

(4) The first photodiode 51 and the second photodiode 52 share an N-type semiconductor region (second semiconductor region) 56.

(5) The third photodiode 53 and the fourth photodiode share another N-type semiconductor region (second semiconductor region) 57.

(6) As is clear by referring to FIGS. 15 and 16 in combination, the P-type semiconductor region 55 is electrically connected to a P-type semiconductor region 58 of the first photodiode 51 and a P-type semiconductor region 59 of the fourth photodiode 54.

(7) The N-type semiconductor regions 56 and 57 are electrically connected to each other.

As shown in FIG. 16, in a case where the photodiode shown in FIG. 15 is employed in a photodetector circuit, each of the P-type semiconductor regions 55, 58, and 59 receives a reset signal RST, and the N-type semiconductor regions 56 and 57 are electrically connected to both a gate of a TFT 3 and one electrode of an integral capacitor 4.

According to the configuration (2), the second photodiode 52 has semiconductor regions which are arranged in a same order in which semiconductor regions of the fourth photodiode 54 are arranged. Furthermore, according to the configuration (3), the first photodiode 51 has semiconductor regions which are arranged in a same order in which semiconductor regions of the third photodiode 53 are arranged. When putting different interpretation on this, (i) the semiconductor regions of the second photodiode 52 are arranged in an order reverse to the order in which the semiconductor regions of the third photodiode 53 are arranged, i.e., the semiconductor regions of the second photodiode 52 and the semiconductor regions of the third photodiode 53 are provided so as to be symmetric to each other, and (ii) the semiconductor regions of the first photodiode 51 are arranged in an order reverse to the order in which the semiconductor regions of the fourth photodiode 54 are arranged, i.e., the semiconductor regions of the first photodiode 51 and the semiconductor regions of the fourth photodiode 54 are provided so as to be symmetric to each other.

The configurations (1) through (7) in combination thus meet foregoing requirement: "a plurality of photodiodes have their semiconductor regions which are arranged on a substrate so as to extend in respective directions parallel to the certain direction and so as to have a line-symmetric or point-symmetric arrangement relation as a whole.

Furthermore, the configurations (6) and (7) in combination indicate that the first through fourth photodiodes 51 through 54 are electrically connected to one another in parallel. Thus, in a case where a channel width is selected from a range where an I-V characteristic of the photodiode changes, in a form which can be considered to be linear, in response to a change in the channel width, each of the first through fourth photodiodes 51 through 54 has a channel length being set to a channel length L and a channel width being set to a channel width W/4. This causes the first through fourth photodiodes 51 through 54 in combination to carry out an equivalent operation with that of a reference diode 5.

Note that the photodiodes shown in FIGS. 15 and 16 are of an example in which the four photodiodes are connected to one another in parallel. However, the present embodiment is not limited to this. In case of connecting N-type semiconductor regions to each another and connecting P-type semiconductor regions to one another as in the configurations (6) and (7), it is possible to set N (the number of photodiodes) to an even number of 4 or greater, instead of limiting N to 4.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims. Also, an embodiment based on a proper combination of technical means disclosed in different reference embodiments is encompassed in the technical scope of the present invention.

In the present invention, an "intrinsic semiconductor region" should be closer to an electrically neutral state, as compared to its adjacent semiconductor region having a first polarity and that having a second polarity. Note, however, that the "intrinsic semiconductor region" is preferably a region having no impurity or a region in which a conduction electron density and an electron hole density are equivalent to each other.

A diode of the present invention can be applied to a semiconductor element of a different type Like a TFT. Like the diode of the present invention, the semiconductor element of a different type is an element having a channel width and channel length, a relation of which channel width and channel length to a characteristic is linear or considered to be linear in a case where ranges of the channel width and the channel length are selected as needed.

Such semiconductor element can be specified as follows.

A semiconductor element, including:

N semiconductor elements (N: an even number of 2 or larger), each having (i) semiconductor regions which are identical in size, in a certain direction parallel to a channel length of a reference semiconductor element, to those of the reference semiconductor element and (ii) a identical channel width W1 which is smaller than a channel width W of the reference semiconductor element, where it is assumed that the reference semiconductor element has the channel width W, and that the reference semiconductor element has (i) a first semiconductor region which is relatively high in impurity concentration, (ii) a channel region which is a semiconductor region and is relatively low in impurity concentration, and (iii) a second semiconductor region which is relatively high in impurity concentration, and the first semiconductor region, the channel region, and the second semiconductor region being in contact with one another and being arranged, in this order, in the certain direction in a surface of a substrate, corresponding semiconductor regions of N semiconductor elements being arranged on the substrate, in a direction parallel to the certain direction, so as to have a line-symmetric or point-symmetric arrangement relation as a whole, and the N semiconductor element being electrically connected to one another so as to carry out an operation equivalent to that of the reference semiconductor element.

The semiconductor element specified by the configuration includes not only (i) a diode whose channel is designed in consideration of uses of different masks (a mask for preparing N-type and a mask for preparing P-type), but also (ii) a semiconductor element in which two ends of a channel length is designed by respective different layers, i.e., a semiconductor element having an asymmetric configuration.

An example of the semiconductor element thus having the asymmetric configuration includes a TFT in which a channel length is defined by an n-type region and a gate end. More specifically, such TFT includes, out of TFTs having GOLD configuration, a TFT having a one-side GOLD configuration in which an LDD region is provided only on, for example, a drain side. Note that the GOLD configuration indicates a configuration in which a gate electrode is provided not only in opposition to a channel region, but also in opposition to the LDD region so that the gate electrode and the LDD region overlap each other.

A display device of the present invention can be any of a liquid crystal display device and an EL display device, provided that it is a display device including an active matrix substrate.

The diode of the present invention can also be configured as follows. That is, the diode includes: a first diode having (i) a first semiconductor region of a first type which is relatively high in impurity concentration, (ii) a channel region which is a semiconductor region and is relatively low in impurity concentration, and (iii) a second semiconductor region of a second-type which is relatively high in impurity concentration, the second-type being opposite to the first-type, and the first semiconductor region, the channel region, and the second semiconductor region being in contact with one another and being arranged, in this order, in a certain direction in a surface of a substrate; and a second diode having semiconductor regions substantially identical in size with the semiconductor regions of the first diode, the first diode and the second diode arranged symmetrically on the substrate so that a bias direction obtained in the first diode is reverse to a bias direction obtained in the second diode, and the first diode and the second diode are electrically connected to each other in parallel so as to carry out an equivalent operation with that of a diode having a channel width which is two times larger than that of the first diode or that of the second diode.

In case of assuming, with respect to the configuration, an example in which the first semiconductor region, the channel region, and the second semiconductor region of the first diode are arranged, in this order, in a direction in the surface of the substrate, the second diode is configured under the requirement "the first diode and the second diode are arranged symmetrically on the substrate so that the bias direction obtained in the first diode is reverse to the bias direction obtained in the second diode", so that a second semiconductor region, a channel region, and a first semiconductor region of the second diode are arranged, in this order from a close side to the first diode, along the same direction in which the semiconductor regions of the first diode are arranged.

The first diode and the second diode are thus electrically connected to each other in parallel. In the case of the example, the two first semiconductor regions are electrically connected to each other, and the two second semiconductor regions are electrically connected to each other.

In case of the configuration, if there occurs positional displacement of a mask, which is used in preparing the semiconductor regions by impurity ion implantation, toward a first direction so as to cause a reduction in channel length of the first diode, the positional displacement of mask toward the first direction also occurs to the second diode. The first direction is headed from the first semiconductor region to the channel region in the first diode, and is headed from the channel region to the first semiconductor region in the second diode.

Therefore, in the second diode, there occurs positional displacement of the mask, which is used in preparing the first semiconductor regions, toward a direction headed from the channel region to the first semiconductor region. Thus, a channel length of the second diode is increased. In this situation, there is a relation that a size by which the increase in channel length of the second diode occurs is identical with a size by which the reduction in channel length of the first diode occurs.

Thus, with the invention, even in a case where positional displacement of a mask occurs, the reduction in channel length of the first diode is offset by the increase in channel length of the second diode.

Note that if a change in I-V characteristic due to the reduction in channel length and a change in I-V characteristic due to the increase in channel length are not offset by each other, there will rise a problem in that an I-V characteristic of a diode varies depending on a degree of the positional displacement of a mask. However, the present invention is an invention which prevents such problem and in which two opposite changes in characteristic are offset by each other.

This is assured under the requirement "the first diode and the second diode in combination carry out an equivalent operation with that of a diode which has a channel width two times larger than that of the first diode or that of the second diode". A concrete example of this is that in a case where such diode is used as a photodiode, it generates a photocurrent whose amplitude is always proportional to a channel width, and can be, in a case where a range of a channel length is selected as needed, proportional to the channel length.

The requirement "the first diode and the second diode in combination carry out an equivalent operation with that of a diode which has a channel width two times larger than that of the first diode or that of the second diode" indicates that a range of the channel length, where an I-V characteristic of a diode changes proportionally to the channel length, is selected as needed.

Thus, with the present invention, regardless of positional displacement of a mask for preparing the first semiconductor regions and positional displacement of a mask for preparing the second semiconductor region, which occur independently from each other, it is always possible to manufacture diodes having a stable characteristic which in combination carries out an equivalent operation with an operation of a diode having a channel width which is two times larger than that of the first diode or that of the second diode.

In comparison to the diode thus having the channel width two times larger, a channel width of the each of the first diode and the second diode is equal to ½. Thus, it is possible to reduce, in direction parallel to a channel width, an area occupied by the first diode and the second diode on a substrate.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims. Also, an embodiment based on a proper combination of technical means disclosed in different reference embodiments is encompassed in the technical scope of the present invention.

A diode of the present invention includes: N diodes (N: an even number of 2 or larger), each having (i) semiconductor regions which are identical in size, in a direction parallel to a channel length of a reference diode, to those of the reference diode and (ii) an identical channel width W1 which is smaller than a channel width W of the reference diode, where it is assumed that the reference diode has the channel width W, and that the reference diode has (i) a first semiconductor region of a first-type which is relatively high in impurity concentration, (ii) a channel region which is a semiconductor region and is relatively low in impurity concentration, and (iii) a second semiconductor region of a second-type which is relatively high in impurity concentration, the second-type being opposite to the first-type, and the first semiconductor region, the channel region, and the second semiconductor region being in contact with one another and being arranged, in this order, in a certain direction in a surface of a substrate, corresponding semiconductor regions of the plurality of diodes being arranged on the substrate, in a direction parallel to the certain direction, so as to have a line-symmetric or point-symmetric arrangement relation as a whole, and the plurality of diodes being electrically connected to one another so as to carry out an operation equivalent to that of the reference diode.

This brings about an effect that makes it always possible to manufacture, regardless of the positional displacement of a mask for preparing first semiconductor regions or the positional displacement of a mask for preparing second semiconductor regions, which occur independently from each other, diodes having a stable characteristic which in combination carry out an equivalent operation with an operation of the reference diode.

Thus, in a photodetector circuit of the present invention, any of the diodes discussed so far is employed as a photodiode.

This gives the photodetector circuit of the present invention a light receiving characteristic which is not affected by any positional displacement of a mask occurring in a manufacturing step. Also, this brings about a secondary effect that improves pixel aperture rate and so on, in such case where the photodetector circuit is provided in a pixel of a liquid crystal display device.

Thus, in a display device of the present invention, the photodetector circuit is included in one or more of a plurality of pixels for constituting a display screen.

This brings about an effect that provides an excellent display device: whose functions using a function of a photodetector are stable; and which carries out bright display.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

INDUSTRIAL APPLICABILITY

The present invention can be applied to (i) a semiconductor element, whose characteristic to a channel width and a channel length has a linear relation or a relation which can be regarded as a linear relation, (ii) an electronic circuit including the semiconductor element, and (iii) an apparatus including the electronic circuit.

The invention claimed is:

1. A diode, comprising:
N diodes (N: an even number of 2 or larger), each having (i) semiconductor regions which are identical in size, in a certain direction parallel to a channel length of a reference diode, to those of the reference diode and (ii) a substantially identical channel width W1 which is smaller than a channel width W of the reference diode, where it is assumed that the reference diode has the channel width W, and that the reference diode has (i) a first semiconductor region of a first-type which is relatively high in impurity concentration, (ii) a channel region which is a semiconductor region and is relatively low in impurity concentration, and (iii) a second semiconductor region of a second-type which is relatively high in impurity concentration, the second-type being opposite to the first-type, and the first semiconductor region, the channel region, and the second semiconductor region being in contact with one another and being arranged, in this order, in the certain direction in a surface of a substrate,
corresponding semiconductor regions of the N diodes being arranged on the substrate, in a direction parallel to the certain direction, so as to have a line-symmetric or point-symmetric arrangement relation as a whole, and
the N diodes being electrically connected to one another so as to carry out an operation equivalent to that of the reference diode.

2. The diode as set forth in claim 1, wherein a channel region of each of the N diodes has a channel length which is selected from a range where an I-V characteristic, which is indicative of a relation between a current flowing in a diode and a voltage across the diodes, is considered to change linearly in response to a change in the channel length.

3. The diode as set forth in claim 1, wherein:
the channel width W1 is equal to W/N; and
the N diodes are electrically connected to one another in parallel.

4. The diode as set forth in claim 1, wherein:
the N diodes includes a first group of N/2 diodes which are electrically connected to one another in series, and a second group of N/2 diodes which are electrically connected to one another in series, the first group of N/2 diodes and the second group of N/2 diodes being electrically connected to each other in parallel; and
the channel width W1 is equal to W/2.

5. The diode as set forth in claim 1, wherein:
the N diodes are a first diode and a second diode; and
the first diode and the second diode are provided in a single Si island, and share a first semiconductor region as the first semiconductor region or a second semiconductor region as the second semiconductor region.

6. The diode as set forth in claim 1, wherein:
the N diodes are a first diode, a second diode, a third diode, and a fourth diode which are arranged, in this order, in the certain direction; and
the first diode and the second diode are electrically connected to each other, in series, in the certain direction, and the third diode and the fourth diode are electrically connected to each other, in series, in the certain direction, the first diode has a configuration equivalent to that of the third configuration, and the second diode has a configuration equivalent to that of the fourth diode, the second diode and the third diode share a first semiconductor region as the first semiconductor region, the first diode and the second diode share a second semiconductor region as the second semiconductor region, and the third diode and the fourth diode share a second semiconductor region as the second semiconductor region, the first semiconductor regions are electrically connected to each other, and the second semiconductor regions are electrically connected to each other.

7. A photodetector circuit, in which the diode recited in claim 1, is employed as a photodiode.

8. The photodetector circuit as set forth in claim 7, comprising:

a transistor, via whose drain and source, (i) a power supply line via which a power voltage is supplied and (ii) an output signal line via which a photodetection signal of a photodetector circuit is outputted are connected to each other;

a row selection signal line via which a row selection signal is supplied so as to cause, via a capacitor, a rapid increase in gate electric potential of the transistor during a reading period of the photodetection signal; and a reset signal line via which a reset signal is supplied, the reset signal serving as a first voltage during a reset period of the photodiode and as a second voltage during a photodetection period, the first voltage causing a forward voltage to be applied across the photodiode and the second voltage causing a reverse voltage to be applied across the photodiode.

9. The photodetector circuit as set forth in claim 8, wherein each of the N diodes for constituting the photodiode has (i) a cathode which is connected to a gate of the transistor, the gate of the transistor and the row selection signal line being connected to each other via the capacitor, and (ii) an anode which is connected to the reset signal line.

10. The photodetector circuit as set forth in claim 8, wherein:

the photodiode includes a first group of N/2 diodes which are electrically connected to one another in series, and a second group of N/2 diodes which are electrically connected to one another in series; and (i) a cathode of a diode at one end of the first group of N/2 diodes and a cathode of a diode at one end of the second group of N/2 diodes are connected to a gate of the transistor, the gate of the transistor and the row selection signal line being connected to each other via the capacitor, and (ii) an anode of a diode at the other end of the first group of N/2 diodes and an anode of a diode at the other end of the second group of N/2 diodes are connected to the reset signal line.

11. The photodetector circuit as set forth in claim 7, comprising:

first and second transistors connected to each other in series, (i) a power supply line via which a power voltage is supplied and (ii) an output signal line via which a photodetection signal of a photodetector circuit is outputted being connected to each other via a drain and a source of the first transistor and via a drain and a source of the second transistor;

a row selection signal line via which a row selection signal is supplied to a gate of the second transistor;

a reset signal line via which a reset signal is supplied, the reset signal serving as a first voltage during a reset period of the photodiode and as a second voltage during a photodetection period, the first voltage causing a forward voltage to be applied across the photodiode and the second voltage causing a reverse voltage to be applied across the photodiode; and the photodiode having a cathode which is connected to a gate of the first transistor and is connected to the power supply voltage line via a capacitor.

12. A display device, in which a photodetector circuit recited in claim 1, is included in one or more of a plurality of pixels for constituting a display screen.

13. The display device as set forth in claim 12, wherein:

the photodetector circuit is included in a predetermined number of adjacent pixels of the plurality of pixels; and the diode and the other elements for constituting the photodetector circuit are provided and dispersed in the predetermined number of adjacent pixels.

14. The display device as set forth in claim 12, wherein:

each of the plurality of pixels is made up of a red sub-pixel, a green sub-pixel, and a blue sub-pixel; and the N diodes for constituting the photodetector circuit are provided and dispersed in the red sub-pixel and the blue sub-pixel.

* * * * *